United States Patent [19]
Watanabe et al.

[11] Patent Number: 5,409,547
[45] Date of Patent: Apr. 25, 1995

[54] THERMOELECTRIC COOLING DEVICE FOR THERMOELECTRIC REFRIGERATOR, PROCESS FOR THE FABRICATION OF SEMICONDUCTOR SUITABLE FOR USE IN THE THERMOELECTRIC COOLING DEVICE, AND THERMOELECTRIC REFRIGERATOR USING THE THERMOELECTRIC COOLING DEVICE

[75] Inventors: Hideo Watanabe, Kawasaki; Motohiro Sakai, Yokohama; Fumio Hisano, Noboribetsu; Atsushi Osawa, Yokohama; Hirofusa Tezuka, Noboribetsu, all of Japan

[73] Assignee: Thermovonics Co., Ltd., Japan

[21] Appl. No.: 128,697

[22] Filed: Sep. 30, 1993

[30] Foreign Application Priority Data

Oct. 5, 1992 [JP] Japan .................. 4-266126
May 6, 1993 [JP] Japan .................. 5-105526

[51] Int. Cl.⁶ .......................................... H01L 35/28
[52] U.S. Cl. ........................... 136/204; 136/224; 136/236.1; 136/201; 62/3.6; 62/3.7
[58] Field of Search .............. 136/201, 203, 204, 224, 136/225, 236.1, 238, 240; 419/45, 46; 62/3.2, 3.3, 3.6, 3.63, 3.7

[56] References Cited

U.S. PATENT DOCUMENTS

| | | | |
|---|---|---|---|
| 3,097,027 | 7/1963 | Mims et al. | 308/189 |
| 3,162,531 | 12/1964 | Yamano et al. | 75/226 |
| 3,635,037 | 1/1972 | Hubert | 62/3 |
| 3,681,929 | 8/1972 | Schering | 62/3 |
| 4,634,803 | 1/1987 | Mathiprakasam | 136/212 |
| 4,828,627 | 5/1989 | Connery | 136/203 |
| 4,929,282 | 5/1990 | Brun et al. | 136/239 |
| 5,006,505 | 4/1991 | Skertic | 505/1 |
| 5,040,381 | 8/1991 | Hazen | 62/3.2 |
| 5,168,339 | 12/1992 | Yokotani et al. | 257/64 |
| 5,246,504 | 9/1993 | Ohta et al. | 136/201 |
| 5,316,858 | 5/1994 | Higashigaki et al. | 428/457 |

FOREIGN PATENT DOCUMENTS

| | | |
|---|---|---|
| 0176671 | 4/1986 | European Pat. Off. . |
| 0335213 | 10/1989 | European Pat. Off. . |
| 2-198179 | 8/1990 | Japan . |
| 3-187280 | 8/1991 | Japan . |
| 3-263382 | 11/1991 | Japan . |
| 2119170 | 11/1983 | United Kingdom . |

OTHER PUBLICATIONS

T. Lund, "Rectangular monolithic infinite-cascade thermojunctions", J. Phys. D: Appl. Phys., vol. 11, 1978, pp. 1319–1329.

P. W. Cowling et al., "Development of a Modified Cascade Thermoelectric Heat Pump", Energy Conversion, vol. 9, pp. 107–117, 1969.

R. A. Kull et al., "SP-100 Converter Multicouple Thermoelectric Cell", Proceedings of the 25th Energy Conversion Engineering Conference, vol. 1, pp. 192–197, Aug. 12–17, 1990.

*Primary Examiner*—Donald P. Walsh
*Assistant Examiner*—Chrisman D. Carroll
*Attorney, Agent, or Firm*—Evenson, McKeown, Edwards & Lenahan

[57] ABSTRACT

A thermoelectric cooling device for a thermoelectric refrigerator is described. The device is composed of p-type and n-type semiconductor layers, a first inner heat conductor, a first outer heat conductor, a second inner heat conductor, and a second outer heat conductor. The p-type and n-type semiconductor layers are electrically connected in series via the electrodes. The p-type and n-type semiconductor layers have a specific average thickness. The average figures of merit of the p-type and n-type semiconductor layers are controlled to a particular value. The thermal conductances of the first and second, inner and outer heat conductors fall within specific ranges, respectively. The coefficient of performance defined in terms of the ratio of the quantity of absorbed heat to inputted power is at least 0.6. Also described are a process for the fabrication of a semiconductor suitable for use in the thermoelectric cooling device and also a thermoelectric refrigerator using the thermoelectric cooling device.

11 Claims, 28 Drawing Sheets

FIG.23
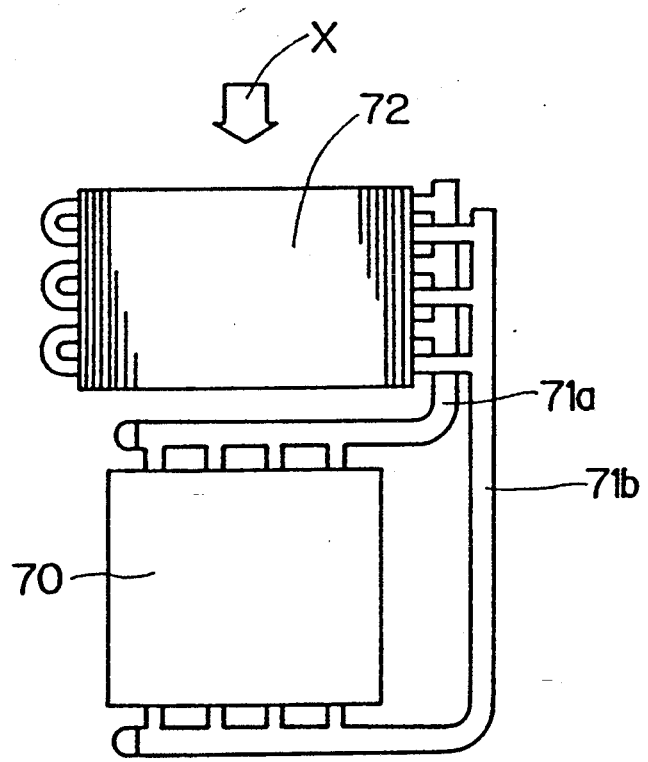
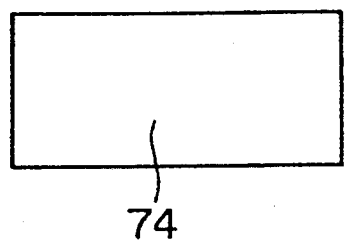

THERMOELECTRIC COOLING DEVICE FOR THERMOELECTRIC REFRIGERATOR, PROCESS FOR THE FABRICATION OF SEMICONDUCTOR SUITABLE FOR USE IN THE THERMOELECTRIC COOLING DEVICE, AND THERMOELECTRIC REFRIGERATOR USING THE THERMOELECTRIC COOLING DEVICE

FIELD OF THE INVENTION

This invention relates to a thermoelectric cooling device, especially to a thermoelectric cooling device for a thermoelectric refrigerator. Further, this invention is concerned with a process for the fabrication of a semiconductor suitable for use in the thermoelectric cooling device and also with a thermoelectric refrigerator using the thermoelectric cooling device.

DESCRIPTION OF THE RELATED ART

Among thermoelectric devices, those capable of cooling a desired object or item upon input of electric energy are called Peltier devices or thermoelectric cooling devices and are used, for example, in compact cool boxes or the like. They are capturing interests as cooling means which do not use any cooling medium, for example, a chlorofluorocarbon such as "Freon" or "Flon".

A conventional thermoelectric cooling device is constructed as illustrated in FIG. 35. Namely, a heat-absorbing-side electrode 102 is formed above a heat-absorbing-side insulating substrate 100 made of alumina or the like via a heat-absorbing-side solder layer 101. On the heat-absorbing-side electrode 102, a p-type semiconductor layer 103 and an n-type semiconductor layer 104 are both formed.

A heat-dissipating-side electrode 105 is formed so that the p-type semiconductor layer 103 and the n-type semiconductor layer 104 are connected to each other. Above the heat-dissipating-side electrode 105, a heat-dissipating-side insulating substrate 107 made of alumina or the like is provided via a heat-dissipating-side solder layer 106.

A number of such p-type semiconductor layers 103 and n-type semiconductor layers 104 are alternately interposed between the heat-absorbing-side insulating substrate 100 and the heat-dissipating-side insulating substrate 107 and are electrically connected in series.

Feeding of a predetermined current across the thermoelectric cooling device causes absorption of heat on a side of the heat-absorbing-side insulating substrate 100 so that cooling takes place around the heat-absorbing-side insulating substrate 100. On the other hand, dissipation of heat takes place on a side of the heat-dissipating-side insulating substrate 107. External dissipation of heat by heatsinks or the like therefore induces transfer of heat.

The heat pumping capacity by the thermoelectric cooling device has heretofore been expressed by the following formula (i):

$$Q_{ab} = nST_c I - (\tfrac{1}{2}) I^2 R - K \cdot \Delta T \qquad \text{(i)}$$

where
Q: Heat pumping capacity (W)
n: Number of semiconductor elements (pieces)
S: Seebeck coefficient (V/K)
$T_c$: Cold side temperature of the semiconductor (K)
I: Value of current fed across the thermoelectric cooling device (A)
R: Internal resistance of thermoelectric cooling device (Ω)
K: Coefficient of heat transmission across the thermoelectric cooling device (W/K)

The above formula was however derived from qualitative consideration, and its concept is based on the presumption that the temperature distribution within the device is linear. Moreover, it is a thermal calculation focused solely on the thermoelectric cooling device, thereby failing to permit the evaluation of performance of the entire system including the thermoelectric cooling device (for example, the system as a thermoelectric refrigerator).

Further, the correlation between the figure of merit (Z) of the thermoelectric cooling device and the maximum value $\phi_{max}$ of the coefficient of performance has been defined by the following formula (ii):

$$\phi_{max} = 1/T_c \, (T_c/2 - \Delta T / Z / T_c) \qquad \text{(ii)}$$

where
$\phi_{max}$: Maximum of coefficient of performance
$T_c$: Cold side temperature of the semiconductor (K)
Z: Figure of merit of the semiconductor
$Z = S^2 \sigma / \kappa$ S: Seebeck coefficient
$\sigma$: Electrical conductivity
$\kappa$: Thermal conductivity
$\Delta T$: Temperature difference between the cold side and the hot side of the semiconductor (K)

Based on the formula (ii), thermoelectric cooling and other cooling systems have been compared in terms of coefficient of performance (COP) as shown in FIG. 36 [see Technical Report (II) of Electric Society of Japan, No. 43]. In the diagram, the coefficients of performance of compression refrigeration, heat absorption system and direct drive heat pump (DDHP) refrigeration are compared assuming that their condensation temperatures and evaporation temperatures are equivalent to the temperatures at the hot and cold junctions of a thermoelectric cooling device.

The diagram however shows nothing more than the upper limit of the theoretical value of coefficient of performance, which the thermoelectric cooling device can take as a discrete device, in other words, under the prerequisite to infinite exchange of heat. The diagram cannot permit the evaluation of performance of the entire system including the thermoelectric cooling device.

In the conventional thermoelectric cooling device, the insulating substrates 100, 107 themselves have a large thermal resistance because, as described above, it is made of ceramics such as alumina or the like.

Further, there are a variety of thermal resistances, including the contact thermal resistances at contact interfaces between an heat-absorbing-side heat conductor such as fins (not illustrated) and the heat-absorbing-side insulating substrate 100, the heat-absorbing-side insulating substrate 100 and the heat-absorbing-side solder layer 101, the heat-absorbing-side solder layer 101 and the heat-absorbing-side electrodes 102, the heat-absorbing-side electrodes 102 and the p-type and n-type semiconductor layers 103, 104, the p-type and n-type semiconductor layers 103, 104 and the heat-dissipating-side electrodes 105, the heat-dissipating-side electrodes 105 and the heat-dissipating-side solder layer 106, the heat-dissipating-side solder layer 106 and the heat-dissipating-side insulating substrate 107, and the heat-dissipating-side insulating substrate 107 and a heat-dissipating-side heat conductor such as fins (not illustrated) as well as thermal resistances of the heat-absorbing-side and heat-dissipating-side heat conductors themselves. The internal temperature difference of the semiconductor device therefore becomes large beyond necessity, so that the cooling performance and the coefficient of performance are reduced significantly. The coefficient of actual cooling performance is therefore about 50% of the theoretical upper limit shown in FIG. 36 or smaller.

SUMMARY OF THE INVENTION

An object of the present invention is therefore to provide a thermoelectric cooling device for a thermoelectric refrigerator, said device being capable of overcoming such drawbacks of the conventional art to permit a substantial improvement in cooling performance and coefficient of performance, a process for the high-productivity fabrication of semiconductors and also a flonless or freonless, thermoelectric refrigerator featuring small dimensions, light weight and low noise.

With the foregoing in view, the present inventors succeeded in deriving a thermoelectric differential equation which can more closely reflect the reality with respect to the conduction of heat across an thermoelectric cooling device. Based on the thermoelectric differential equation, the present inventors have established a method for the analysis of thermal balance in the entire thermoelectric cooling system including a first inner heat conductor and a first outer heat conductor, both arranged outside heat-absorbing-side electrodes of the thermoelectric cooling device, and a second inner heat conductor and a second outer heat conductor, both disposed outside heat-dissipating-side electrodes of the thermoelectric cooling device, and have realized a simulation program which permits effective use of the above method by a computer as simple as a personal computer.

In the course of verification of the simulation program and empirical data, the present inventors paid attention to correlations among the following parameters:

(1) the average figure of merit of the p-type and n-type semiconductors, Z,
(2) the average thickness of the semiconductors, t,
(3) the thermal conductance of the first inner heat conductor on the heat-absorbing side per cm² of the cross-sectional area of the semiconductors, $K_{CP}$,
(4) the thermal conductance of the first outer heat conductor on the heat-absorbing side per cm² of the cross-sectional area of the semiconductors, $K_C$,
(5) the thermal conductance of the second inner heat conductor on the heat-dissipating side per cm² of the cross-sectional area of the semiconductors, $K_{HP}$, and
(6) the thermal conductance of the second outer heat conductor on the heat-dissipating side per cm² of the cross-sectional area of the semiconductors, $K_H$.

The above object has been achieved by specifying the numeral ranges of the individual parameters as will be described below.

In one aspect of the present invention, there is thus provided a thermoelectric cooling device for a thermoelectric refrigerator, said device being composed of:
  a number of p-type semiconductor layers and n-type semiconductor layers arranged side by side,
  a first inner heat conductor having heat-absorbing-side electrodes disposed outside heat-absorbing-side ends of the p-type and n-type semiconductor layers,
  a first outer heat conductor disposed outside the first inner heat conductor,
  a second inner heat conductor having a heat-dissipating-side electrode disposed outside heat-dissipating-side ends of the p-type and n-type semiconductor layers, and
  a second outer heat conductor disposed outside the second inner heat conductor,
  said p-type semiconductor layers and said n-type semiconductor layers being electrically connected in alternating series via said heat-absorbing-side electrodes and said heat-dissipating-side electrode,
  wherein said p-type semiconductor layers and n-type semiconductor layers have an average thickness (t) of at least 0.08 cm, but greater than 0 cm and the average figures of merit (Z) of said p-type semiconductor layers and n-type semiconductor layers are controlled at $2.7 \times 10^{-3}$ /K or above, the thermal conductance ($K_{CP}$) of said first inner heat conductor within a range of 8–20 W/°C.cm² of the cross-sectional area of both the p-type and n-type semiconductor layers, the thermal conductance ($K_C$) of said first outer heat conductor within a range of 3–10 W/°C.cm² of the cross-sectional area of both the p-type and n-type semiconductor layers, the thermal conductance ($K_{HP}$) of said second inner heat conductor within a range of 8–20 W/°C.cm² of the cross-sectional area of both the p-type and n-type semiconductor layers, and the thermal conductance ($K_H$) of said second outer heat conductor within a range of 3–10 W/°C.cm² of the cross-sectional area of both the p-type and n-type semiconductor layers, whereby the coefficient of performance (COP) defined in terms of the ratio ($J_Q/P$) of the quantity ($J_Q$) of absorbed heat to inputted power (P) is at least 0.6.

In a second aspect of the present invention, there is also provided a thermoelectric cooling device of a similar construction to the thermoelectric cooling device according to the first aspect of the present invention,
  wherein said p-type semiconductor layers and n-type semiconductor layers have an average thickness (t) smaller than 0.08 cm, but greater than 0 cm and the average figures of merit (Z) of said p-type semiconductor layers and n-type semiconductor layers are controlled at least $3.0 \times 10^{-3}$ /K or above, the thermal conductance ($K_{CP}$) of said first inner heat conductor within a range of 8–20 W/°C.cm² of the cross-sectional area of both the p-type and n-type semiconductor layers, the thermal conductance ($K_C$) of said first outer heat conductor within a range of 7–10 W/°C.cm² of the cross-sectional area of both the p-type and n-type semiconductor layers, the thermal conductance ($K_{HP}$) of said second inner heat conductor within a range of 8–20 W/°C.cm² of the cross-sectional area of both the p-type and n-type =semiconductor layers, and the thermal conductance ($K_H$) of said second outer heat conductor within a range of 7–10 W/°C.cm² of the cross-sectional area of both the p-type and n-type semiconductor layers, whereby the coefficient of performance (COP) defined in terms of the ratio ($J_Q/P$) of the quantity ($J_Q$) of absorbed heat to inputted power (P) is at least 0.6.

In a third aspect of the present invention, there is also provided a process for the fabrication of a semiconductor suitable for use in a thermoelectric cooling device according to the first or second aspect of the present invention, which comprises:

sintering a granulated ceramic mix for the semiconductor while applying a predetermined voltage across the granulated ceramic mix to produce a plasma discharge between particles of the granulated ceramic mix and hence activating surfaces of the particles and eliminating deposited oxides and adsorbed gas from the surfaces of the particles.

In a fourth aspect of the present invention, there is also provided a thermoelectric refrigerator comprising a thermoelectric cooling device according to the first or second aspect of the present invention, wherein said first inner heat conductor and said first outer heat conductor are arranged inside a cabinet of the refrigerator, said second inner heat conductor and said second outer heat conductor are arranged outside the cabinet of the refrigerator, and at least said second outer heat conductor is provided with a fan for effecting forced air cooling against said second outer heat conductor.

According to the first and second aspects of the present invention, the average figures of merit (Z) of the semiconductor layers and the thermal conductances ($K_{CP}$, $K_C$, $K_{HP}$, $K_H$) of the individual heat conductors are restricted to the specific ranges, respectively, for the corresponding specific thickness ranges of the semiconductor layers, thereby assuring a coefficient of performance, COP, of at least 0.6.

By assuring at least 0.6 for COP as described above, it is possible to provide a thermoelectric cooling device for a thermoelectric refrigerator which can replace an electric refrigerator of the compressor type.

According to the third aspect of the present invention, semiconductors having a high average figure of merit (Z) can be fabricated with good productivity.

According to the fourth aspect of the present invention, assurance of at least 0.6 for COP can provide a thermoelectric refrigerator as a substitute for an electric refrigerator of the compressor type, thereby bringing about such advantages that a refrigerator can be reduced in dimensions, weight and noise.

BRIEF DESCRIPTION OF THE DRAWINGS

The above and other objects, features and advantages of the present invention will become apparent from the following description and the appended claims, taken in conjunction with the accompanying drawings, in which:

FIG. 23 is a left-hand side view of the thermoelectric cooling device of the fifth embodiment;

DETAILED DESCRIPTION OF THE INVENTION AND PREFERRED EMBODIMENTS

Upon application of a thermoelectric cooling element, it has heretofore been the practice to conduct a thermal calculation under the assumption that the cold junction temperature $T_O$ and hot junction temperature $T_L$ of a semiconductor employed in the thermoelectric cooling element have become equal to certain temperatures, respectively. In reality, however, $T_O$ and $T_L$ are determined in accordance with operation conditions for heat conductors, which are arranged outside the cold junction and hot junction respectively, and the thermoelectric cooling element. The conventional thermal calculation was therefore inappropriate as described above.

Figure 24:
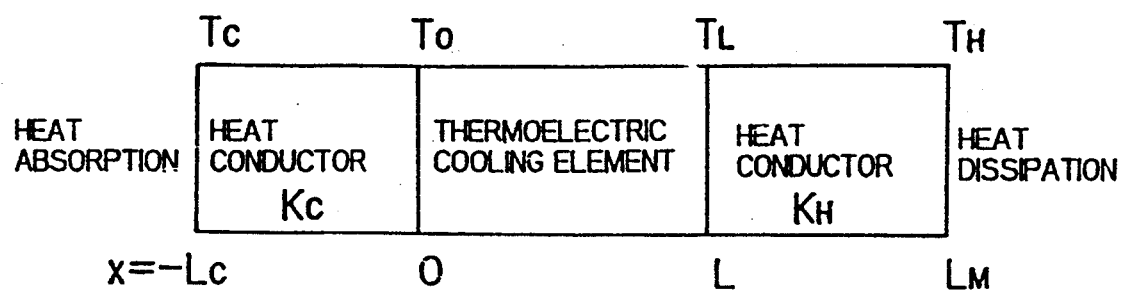
FIG. 24 is a schematic illustration of a simplified model of a thermoelectric cooling device according to the present invention.

Based on the differential equation on heat conduction derived by Ogawa et al. and reported in August, 1992 [Journal of Japanese Society of Electronic Information and Communication, C-11, J75-C-11(8), 416–424, August, 1992], a study was made on a one-dimensional model in which, as shown in FIG. 24, heat conductors are bonded to opposite ends of a thermoelectric cooling element and by using the Peltier effect, heat is absorbed from the left-hand side and power for driving the thermoelectric cooling element is fed and the absorbed heat are dissipated, both to the right-hand side as viewed in the drawing. The cross-sectional area of the thermoelectric cooling element was used as a unit cross-sectional area (1 cm$^2$) and the respective heat conductors had thermal conductances ($K_C$ on the heat-absorbing side, $K_H$ on the heat-dissipating side) per unit cross-sectional area of the semiconductor.

Assuming that the temperatures at the respective positions along x-axis in the drawing are as follows:
$T_C$ at $\chi = -L_C$,
$T_O$ at $\chi = 0$,
$T_L$ at $\chi = L$, and
$T_H$ at $\chi = L_M$.
the heat conduction formula in a steady state is given by:

$$\kappa (d^2T/d\chi^2) = J \cdot [d(\alpha T)/d\chi] - J^2\sigma - d\kappa/d\chi \cdot dT/d\chi \quad (1)$$

and the heat flux $J_Q(\chi)$ is given by:

$$J_Q(\chi) = \alpha J T - \kappa(dT/d\chi) \quad (2)$$

where
$\kappa$: Thermal conductivity (W/cm·deg)
$\alpha$: Seebeck coefficient (V/deg) (negative in the case of n-type but positive in the case of p-type)
$\sigma$: Conductivity (S/cm)
$J$: Current density (A/cm$^2$) (negative in the case of n-type)
$T$: Temperature (K)
$\chi$: Distance from the position O (cm)

Assuming further that, in formula (1), $$\alpha T = -(\beta T + |E_F/q|) \quad (3)$$

($\beta = 2K_B/|q|$, $K_B$ Boltzmann constant, q: electric charge; $E_F$: Fermi energy) and $\kappa$ and $\sigma$ are constant, the formula (1) can be converted to the following linear differential equation:

$$\kappa(d^2T/d\chi^2) = \beta J_O dT/d\chi - J_O^2/\rho, J_O = -J \quad (4)$$

The general solution of the equation (4) can be expressed by the following formula:

$$T = \kappa/(\beta^2\sigma) + J_O\chi/(\beta\sigma) - c_1\chi/(\beta J_O) + C_2 \exp(\beta J_O\chi/\kappa) \quad (5)$$

where
$C_1$, $C_2$: integration constants.

On the other hand, formula (2) can be rewritten as follows:

$$J_Q(\chi) = -\alpha J_O T - \eta J_O/(\beta\sigma) - C_2\beta J_O \exp(\beta J_O\chi/\kappa) \quad (6)$$

For a passive heat conductor portion, the following formulae can be established:

$$\kappa(d^2T/d\chi^2) = 0 \quad (7)$$

$$J_Q(\chi) = -\kappa(dT/d\chi) \quad (8)$$

The following general solutions are obtained:

$$T = C_3\chi + C_4 \quad (9)$$

$$J_Q(\chi) = -\kappa C_3 \quad (10)$$

$C_3, C_4$: integration constants

Boundary conditions will then be introduced. Assuming $\kappa = \kappa_C$ when $-L_C \leq p\chi \leq 0$, $$T = (T_O - T_C)\chi/L_c + T_O \quad (11)$$

$$J_Q(O) = \kappa_C(T_C - T_O)/L_C \quad (12)$$

Assuming $\kappa = \kappa_H$ when $L \leq \chi \leq L_H$, $$T = ((T_H - T_L)\chi - T_H L + T_L L_H)/(L_H - L) \quad (13)$$

$$J_Q(L) = \kappa_H(T_L - T_H)/(L_H - L) \quad (14)$$

When $0 \leq \chi \leq L$, $$T_O = \kappa/\beta^2\sigma - C_1\kappa/(\beta J_O) + C_2 \quad (15)$$

$$T_L = \kappa/(\beta^2\sigma) + J_O L/(\beta\sigma) - C_1\kappa/(\beta J_O) + C_2 \exp(\beta J_O L/\kappa) \quad (16)$$

$$J_Q(O) = -(\alpha T_O + \kappa/(\beta\sigma) + C_2\beta) \times J_O \text{ heat pumping capacity} \quad (17)$$

$$J_Q(L) = -J_O(\alpha T_{OL} + \kappa/(\beta\sigma) + C_2\beta \exp(\beta J_O L/\kappa)) \quad (18)$$

From formulas (15) and (16), $$C_2 = B\{T_L - T_O - J_O L/(\beta\sigma)\}$$

$$C_1 = \beta J_O/\kappa\{\kappa/(\beta^2\sigma + C^2 - T_O\}$$ (19)

$$B = 1/(\exp(\beta J_O L/\kappa) - 1)$$

Now assuming $$F_O = (-\alpha + B\beta)J_O + \kappa_C/L_C$$

$$G_O = \kappa_C T_C/L_C + J_O\{\kappa/(\beta\rho) - \beta J_O L/\sigma\}$$

$$F_L = \{-\alpha - \beta(1+B)\}J_O - \kappa_H/(L_H - L)$$

$$G_L = -\kappa_H T_H/(L_H - L) + J_O \\ \{\kappa/(\beta\sigma) - J_O L(1+B)/\sigma\}$$ (20)

The temperatures at the opposite ends of the thermoelectric cooling element can be expressed as follows:

$$D = F_O F_L + (\beta J_O)^2 B(1+B)$$

$$T_O = (F_L G_O + B\beta J_O G_L)/D$$

$$T_L = (F_O G_L - (1+B)\beta J_O G_O)/D$$ (21)

The input power density P is represented by the following formula:

$$P = J_O^2 L/\sigma + |\alpha| J_O(T_L - T_O)$$ (22)

The COP is expressed as follows:

$$COP = J_Q(O)/P$$ (23)

whereby various necessary values can be determined.

It was then confirmed whether a temperature determined in accordance with formula (5) was in conformity with an actual value. Semiconductor chips of $3 \times 3$ mm$^2$ in cross-sectional area and 10 mm in height were assembled in a $\pi$ (pi) form and the current density J was controlled at 44.4 A/cm$^2$. The temperature on a side wall of the semiconductor was then measured by a non-contact thermometer of the infrared detection type.

The followings are conditions such as physical properties of the semiconductors used:
  Seebeck coefficient: 205 $\mu$V/K
  Thermal conductivity: 0.0115 W/cmK
  Electrical conductivity: 600 S/cm
  0.1 W/°C.cm$^2$
  $K_C$: W/°C.cm$^2$
  $K_H$: 1 W/°C.cm$^2$
  $T_C$: 4.18° C.
  $T_H$: 35° C.

Figure 25:
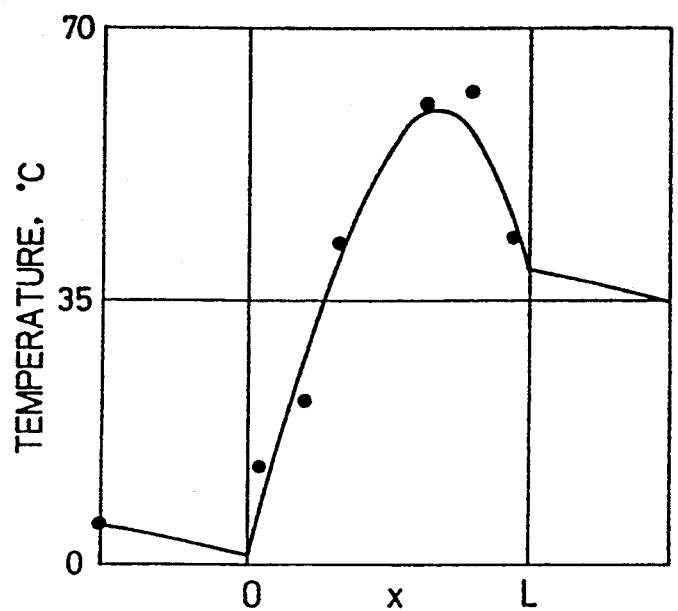
FIG. 25 is a characteristic diagram illustrating a simulated temperature distribution in comparison with an actually-measured temperature distribution.

The results of the above comparison are diagrammatically shown in FIG. 25, in which the solid curve indicates the temperature distribution inside the thermoelectric cooling element as simulated in accordance with the formula (5) and the dots are plots of values actually measured. It is envisaged that the present theory conforms well with the actual measurement values.

Figure 26:
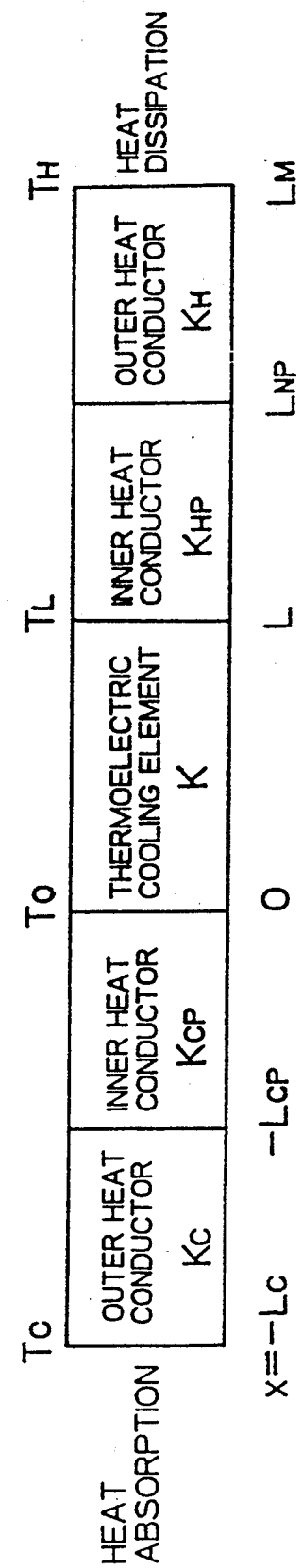
FIG. 26 is a schematic illustration of a simplified model of another thermoelectric cooling device according to the present invention.

The foregoing is based on the model which has simplified a one-dimensional stream of heat. As a matter of fact, it is more practical to divide a heat conductor, for example, into an outer heat conductor such as fins and an inner heat conductor such as a solder layer, an electrode, a heat-conductive medium and the like. The construction of such a model is depicted in FIG. 26, in which $K_C$, $K_H$, $K_{CP}$ and $K_{HP}$ have the following meanings:

$K_C, K_H$: The thermal conductances of outer heat conductors arranged on heat-absorbing and heat-dissipating sides, respectively. These conductances are conductances per unit cross-sectional area of semiconductors of a thermoelectric cooling element. For example, where the conductance of whole fins on the heat-absorbing side is 5 W/°C. and the total cross-sectional area of the semiconductor layers is 2 cm$^2$, $K_C$ is 2.5 (=5/2) w/°C.cm$^2$.

$K_{CP}, K_{HP}$: The thermal conductances of heat conductors including entire inner heat conductors interposed between the thermoelectric cooling element and the respective outer heat conductors. They include, for example, (A) metal solders connecting the semiconductor layers, (B) copper electrodes, (C) ceramic substrates, and (D) a below-describe heat-conductive medium such as silicone grease having high heat conductivity. Taking into consideration their thermal conductivities and thicknesses, it is practically sufficient if only (C) and (D) are considered upon actual calculation because (A) and (B) have a substantially greater conductance compared with (C) and (D).

The followings are the thermal conductivities and typical thicknesses of these inner heat conductors:

|  | Thermal conductivity [w/cm$^2$ °C.] | Typical thickness [cm] |
| --- | --- | --- |
| (A) Metal solders | 0.51 | 0.0005–0.002 |
| (B) Copper electrodes | 4.0 | 0.03–0.05 |
| (C) Ceramic (alumina) | 0.21 | 0.05–0.1 |
| (D) Heat-conductive medium (silicone grease) | 0.008 | 0.0005–0.001 |

As a heat-conductive medium such as silicone grease is interposed between each electrode and its associated outer heat conductor without using any ceramic substrate in each embodiment of the present invention to be described subsequently, $K_{CP}$ and $K_{HP}$ are both as high as 8–20 w/°C.cm$^2$.

The efficiency employed in a cooling system is the coefficient of performance (COP). This COP is defined by the ratio of the heat pumping capacity $J_Q$ by a cooling portion to input power P as indicated above by formula (23) [COP=$J_Q$/P].

In a conventional domestic electric refrigerator of the compressor type which uses "Flon" gas as a cooling medium and has a capacity of 90 liters, the input power and the heat pumping capacity are 70.5 W and 42.3 W, respectively, on average under severe conditions in summer that the ambient temperature of the refrigerator is 30° C. The coefficient of performance, COP, is therefore 42.3/70.5=0.6. In winter that the ambient temperature of the refrigerator is 15° C., the heat pumping capacity is 19.9 W, that is, smaller than a half of the heat pumping capacity in summer. The refrigerator therefore requires less input power, so that it is sufficient to choose, as a target, COP=0.6—which is the value for summer during which the ambient conditions are severe—or greater.

If the coefficient of performance COP is 0.6 or greater in the thermoelectric cooling device, the thermoelectric cooling device can be used as a replacement cooling system for a compressor electric refrigerator which uses "Flon" gas. This replacement cooling system has the advantages that the use of "Flon" becomes no longer necessary and a refrigerator reduced in dimensions, weight, noise and the like can be provided.

To increase the coefficient of performance COP to 0.6 or greater, the present inventors studied in various ways. As a result, it was found that the coefficient of performance is affected significantly by the following parameters:

(1) the average figure of merit of the p-type and n-type semiconductors, Z, (2) the average thickness of the semiconductors, t, (3) the thermal conductance of the first inner heat conductor on the heat-absorbing side per cm$^2$ of the cross-sectional area of the semiconductors, $K_{CP}$, (4) the thermal conductance of the first outer heat conductor on the heat-absorbing side per cm$^2$ of the cross-sectional area of the semiconductors, $K_C$, (5) the thermal conductance of the second inner heat conductor on the heat-absorbing side per cm$^2$ of the cross-sectional area of the semiconductors, $K_{HP}$, and (6) the thermal conductance of the second outer heat conductor on the heat-absorbing side per cm$^2$ of the cross-sectional area of the semiconductors, $K_H$.

Of these parameters, a description will first be made of the average figure of merit Z. The average figure of merit Z of semiconductors presently fabricated in a large quantity is $2.5 \times 10^{-3}$ /K or smaller. As processes suitable for obtaining a semiconductor having an average figure of merit Z higher than the average figures of merit of currently available semiconductors, there are plasma sintering, isostatic pressing and zone melting. Fabrication by one of these processes makes it possible to provide a semiconductor having an average figure of merit Z of at least $2.7 \times 10^{-3}$ /K, for example, of from $2.7 \times 10^{-3}$ to $3.5 \times 10^{-3}$ /K. Semiconductors fabricated by these processes are usable in the present invention. Specific fabrication examples of such semiconductors will be described in detail subsequently herein.

With respect to the average thickness t, semiconductors are divided into two groups in view of Z, $K_{CP}$, $K_C$, $K_{HP}$ and $K_H$ as will be described subsequently herein, one being thin semiconductors having a thickness 5 of 0.08 cm or greater, for example, of from 0.08 to 0.15 cm and the other extremely thin semiconductors having a thickness 5 smaller than 0.08 cm, for example, of at least 0.03 cm but smaller than 0.08 cm. In the former group, the upper limit of the thickness t, that is, 0.15 cm is not of absolute requirement, but thicknesses greater than 0.15 cm lead to higher fabrication cost and are hence not preferred. In the latter group, on the other hand, the lower limit of the thickness t, that is, 0.03 cm is not of absolute requirement either, but thicknesses smaller than the lower limit tend to result in cracking and/or chipping upon fabrication or handling of the resulting semiconductors so that such unduly small thicknesses are not preferred.

These $K_{CP}$ and $K_{HP}$ can each be controlled, for example, by adjusting the material, thickness or the like of one or more of members interposed between the semiconductor element and the corresponding outer heat conductor, for example, the above-mentioned solder layer, electrode, ceramic substrate, silicone grease and the like.

The $K_C$ and $K_H$, on the other hand, can each be controlled, for example, by adjusting the material, shape and heat transfer area of the corresponding outer heat conductor, namely, the corresponding heat-absorbing or heat-dissipating fins and/or the quantity of air blown by the corresponding fan and/or by using heat pipes.

Figure 27:
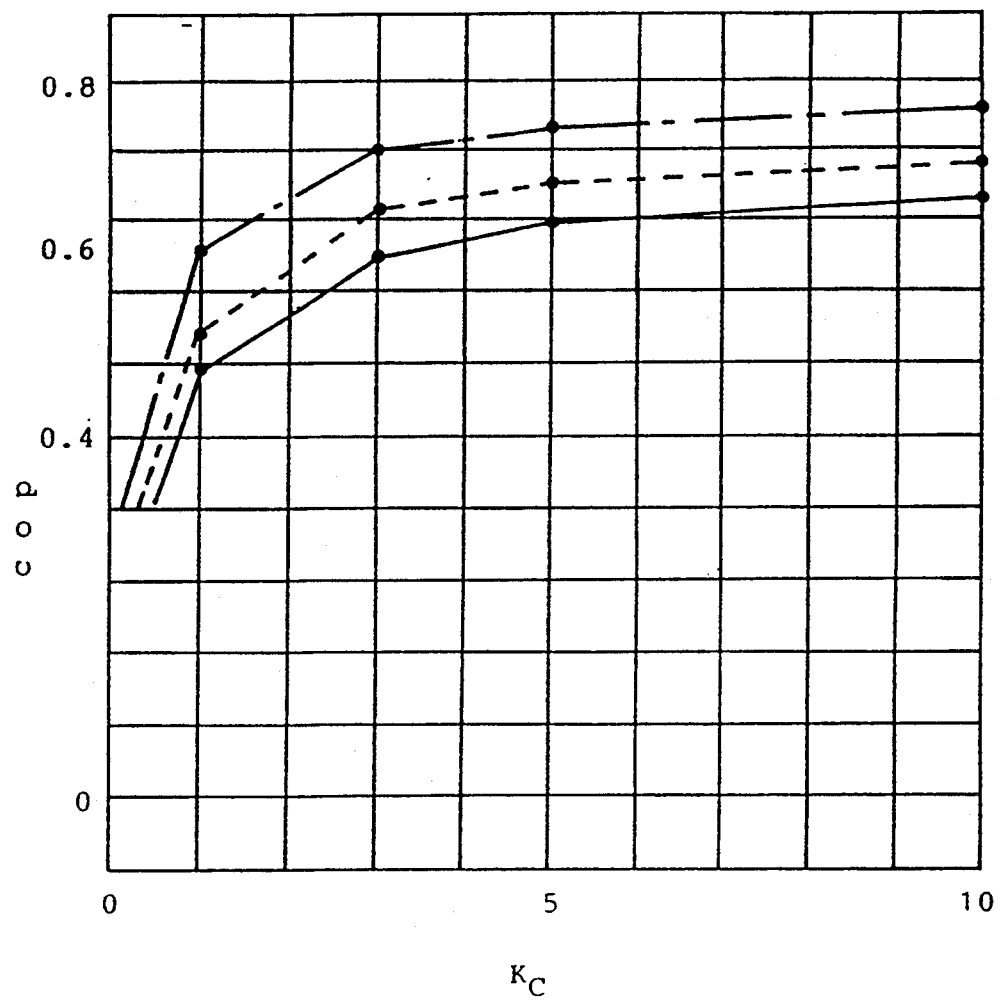
FIG. 27 is a characteristic diagram of $K_C$ versus COP.

FIG. 27 diagrammatically illustrates the relationship between $K_C$ and COP when there were set $Z=2.7 \times 10^{-3}$ /K, $K_H=3$ (W/°C.cm$^2$), $K_{CP}=8$ (W/°C.cm$^2$), and $K_{HP}=8$ (W/°C.cm$^2$). In the diagram, the solid line corresponds to t=0.08 cm, the dashed line to t=0.10 cm, and the alternate long and short dash line to t=0.15 cm.

In the experiment, the interior temperature $T_C$ and the exterior temperature $T_N$ of the refrigerator were set at 0° C. and 30° C., respectively. The experiment was therefore conducted under the severe condition that the temperature difference between the interior and the exterior of the refrigerator was 30° C. This temperature condition applied likewise to the experiments to be described below.

As is apparent from the diagram, $K_H$ of 3 W/°C.cm$^2$ or greater is needed to obtain COP of 0.6 or greater. Even if $K_C$ is increased to 10 W/°C.cm$^2$ or greater, no substantial extra advantage is available but such unduly large $K_C$ leads to higher fabrication cost. Therefore $K_C$ is in the range of 3–10 W/°C.cm$^2$ preferably in a range of 5–10 W/°C.cm$^2$.

Figure 28:
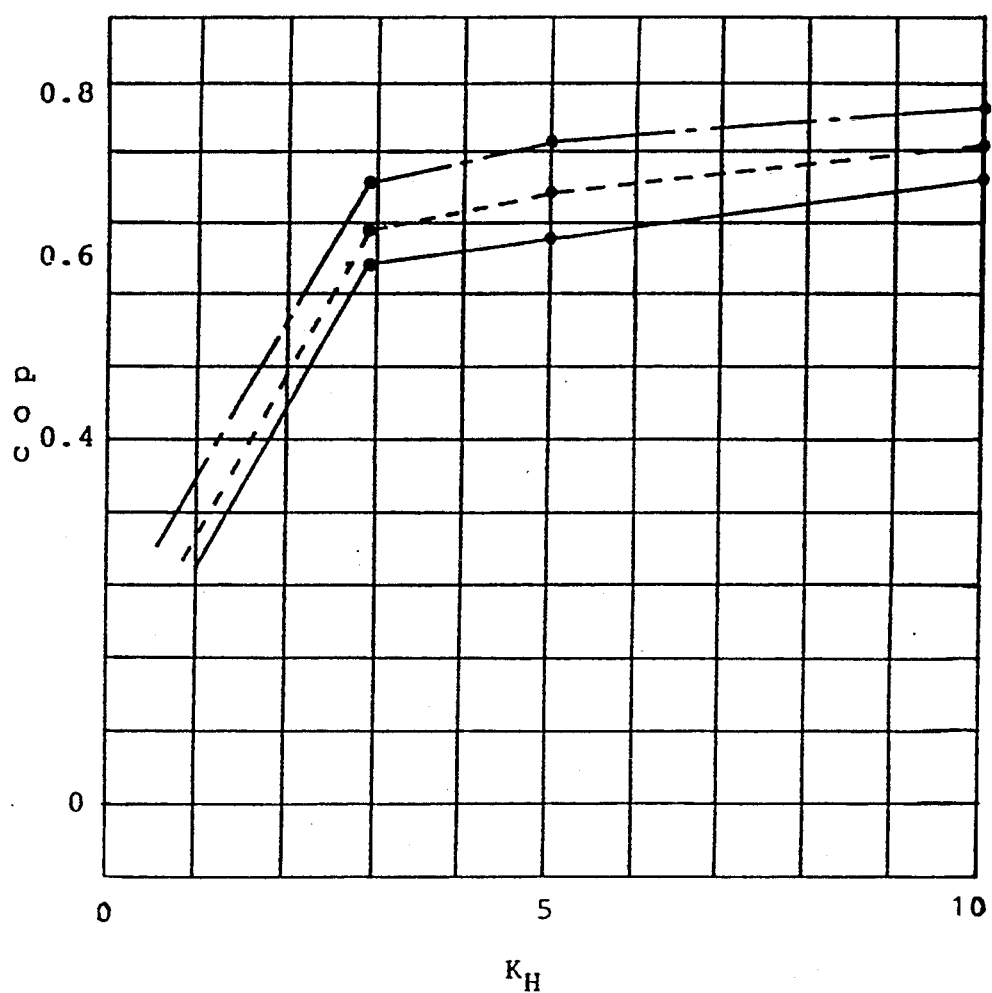
FIG. 28 is a characteristic diagram of $K_H$ versus COP.

FIG. 28 diagrammatically illustrates the relationship between $K_H$ and COP when there were set $Z=2.7 \times 10^{-3}$ /K, $K_C=3$ (W/°C.cm$^2$), $K_{CP}=8$ (W/°C.cm$^2$), and $K_{HP}=8$ (W/°C.cm$^2$). In the diagram, the solid line corresponds to t=0.08 cm, the dashed line to t=0.10 cm, and the alternate long and short dash line to t=0.15 cm.

As is evident from the diagram, $K_H$ of 3 W/°C.cm$^2$ or greater is needed to obtain COP of 0.6 or greater. Even if $K_H$ is increased to 10 W/°C.cm$^2$ or greater, no substantial extra advantage is available but such unduly large $K_H$ leads to higher fabrication cost. Therefore $K_H$ is in the range of 3–10 W/°C.cm$^2$, preferably in a range of 5–10 W/°C.cm$^2$.

Figure 29:
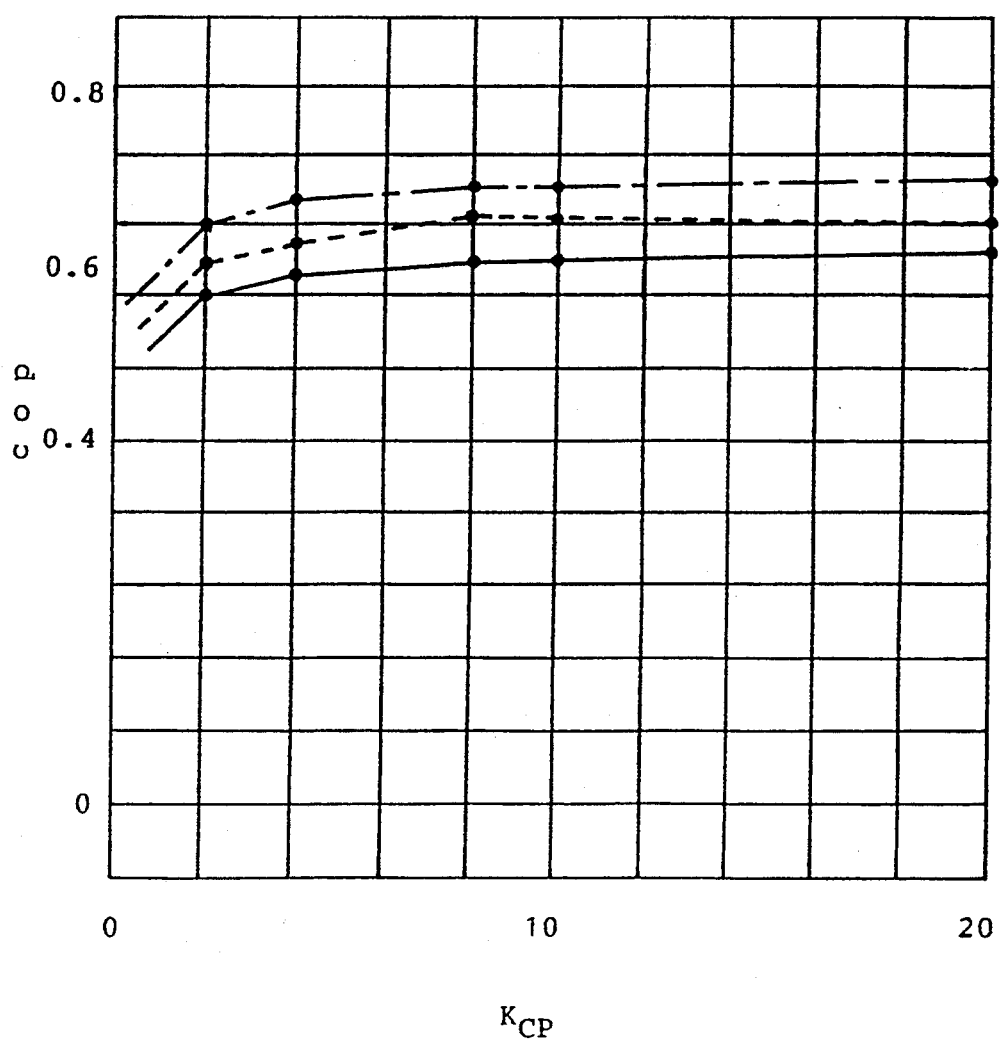
FIG. 29 is a characteristic diagram of $K_{CP}$ versus COP.

FIG. 29 diagrammatically illustrates the relationship between $K_{CP}$ and COP when there were set $Z=2.7 \times 10^{-3}$ /K, $K_C=3$ (W/°C.cm$^2$), $K_H=9$ W/°C.cm$^2$ and $K_{HP}=8$ (W/°C.cm$^2$). In the diagram, the solid line corresponds to t=0.08 cm, the dashed line to t=0.10 cm, and the alternate long and short dash line to t=0.15 cm.

As is clear from the diagram, $K_{CP}$ of 8 W/°C.cm$^2$ or greater is needed to obtain COP of 0.6 or greater. Even if $K_{CP}$ is increased to 20 W/°C.cm$^2$ or greater, no substantial extra advantage is available but such unduly large $K_{CP}$ leads to higher fabrication cost. Therefore $K_{CP}$ is in the range of 8–20 W/°C.cm$^2$, preferably in a range of 10–20 W/°C.cm$^2$.

Figure 30:
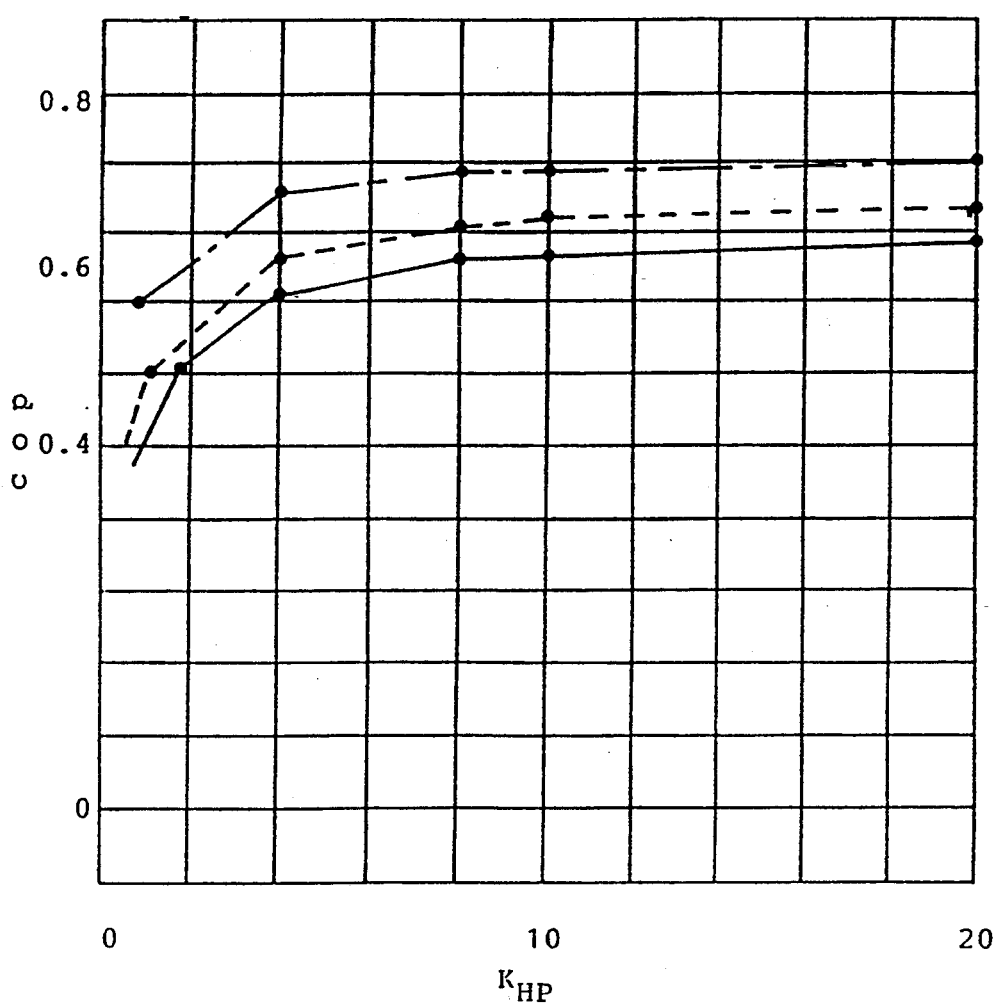
FIG. 30 is a characteristic diagram of $K_{HP}$ versus COP.

FIG. 30 diagrammatically illustrates the relationship between $K_{HP}$ and COP when there were set $Z=2.7 \times 10^{-3}$ /K, $K_C=3$ (W/°C.cm$^2$), $K_H=9$ W/°C.cm$^2$, and $K_{CP}=8$ (W/°C.cm$^2$). In the diagram, the solid line corresponds to t=0.08 cm, the dashed line to t=0.10 cm, and the alternate long and short dash line to t=0.15 cm.

As is clearly envisaged from the diagram, $K_{HP}$ of 8 W/°C.cm$^2$ or greater is needed to obtain COP of 0.6 or greater. Even if $K_{HP}$ is increased to 20 W/°C.cm$^2$ or greater, no substantial extra advantage is available but such unduly large $K_{HP}$ leads to higher fabrication cost. Therefore $K_{HP}$ is in the range of 8–20 W/°C.cm$^2$, preferably in a range of 10–20 W/°C.cm$^2$.

Figure 31:
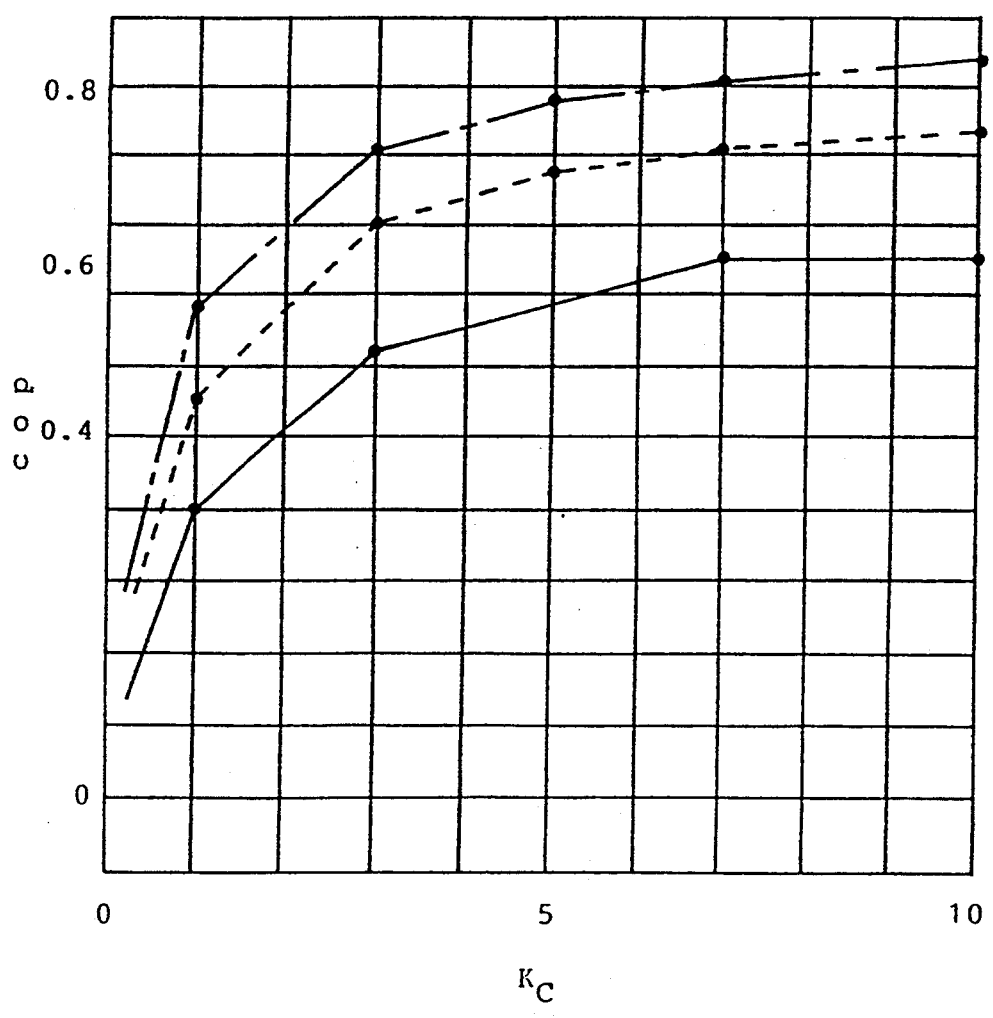
FIG. 31 is another characteristic diagram of $K_C$ versus COP.

FIG. 31 diagrammatically illustrates the relationship between $K_C$ and COP when there were set $Z=3.0\times10^{-3}$ /K, $K_H=7$ (W/°C.cm$^2$), $K_{CP}=8$ (W/°C.cm$^2$), and $K_{HP}=8$ W/°C.cm$^2$. In the diagram, the solid line corresponds to t=0.03 cm, the dashed line to t=0.05 cm, and the alternate long and short dash line to t=0.07 cm.

As is apparent from the diagram, $K_C$ of 7 W/°C.cm$^2$ or greater is needed to obtain COP of 0.6 or greater. Even if $K_C$ is increased to 10 W/°C.cm$^2$ or greater, no substantial extra advantage is available but such unduly large $K_C$ leads to higher fabrication cost. Therefore $K_C$ is in the range of 7-10 W/°C.cm$^2$, preferably in a range of 5-10 W/°C.cm$^2$.

Figure 32:
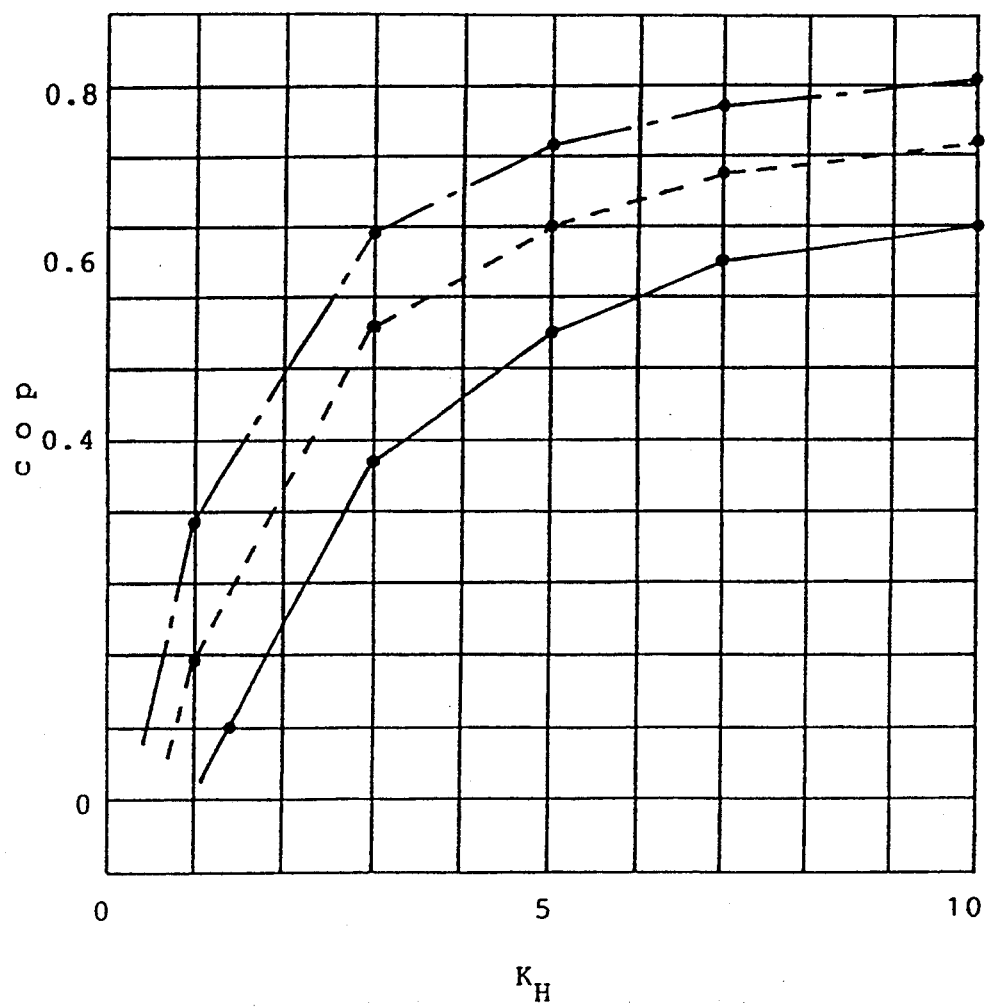
FIG. 32 is another characteristic diagram of $K_H$ versus COP.

FIG. 32 diagrammatically illustrates the relationship between $K_H$ and COP when there were set $Z=2.7\times10^{-3}$ /K, $K_C=7$ (W/°C.cm$^2$), $K_{CP}=8$ (W/°C.cm$^2$), and $K_{HP}=8$ (W/°C.cm$^2$). In the diagram, the solid line corresponds to t=0.03 cm, the dashed line to t=0.05 cm, and the alternate long and short dash line to t= 0.07 cm.

As is evident from the diagram, $K_H$ of 7 W/°C.cm$^2$ or greater is needed to obtain COP of 0.6 or greater. Even if $K_H$ is increased to 10 W/°C.cm$^2$ or greater, no substantial extra advantage is available but such unduly large $K_H$ leads to higher fabrication cost. Therefore $K_H$ is in the range of 7-10 W/°C.cm$^2$, preferably in a range of 5-10 W/°C.cm$^2$.

Figure 33:
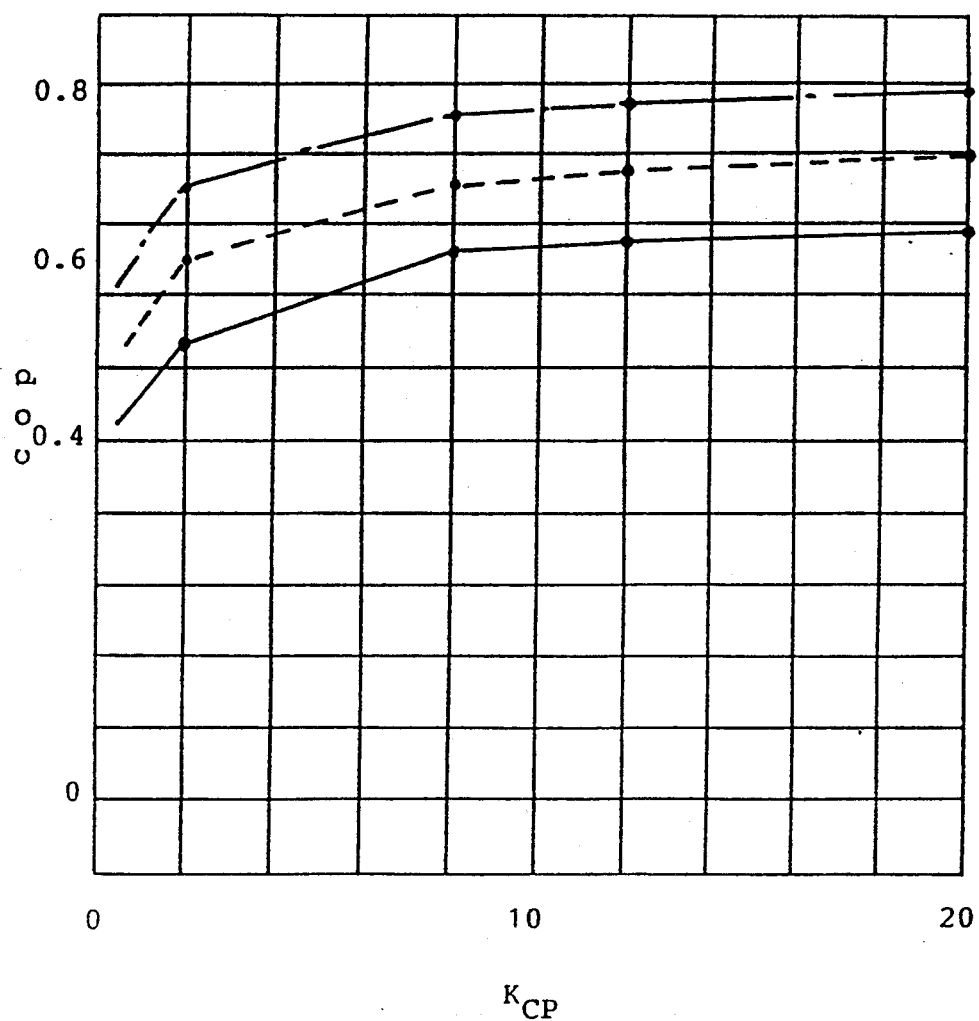
FIG. 33 Is another characteristic diagram of $K_{CP}$ versus COP.

FIG. 33 diagrammatically illustrates the relationship between $K_{CP}$ and COP when there were set $Z=2.7\times10^{-3}$ /K, $K_C=7$ (W/°C.cm$^2$), $K_H=7$ W/°C.cm$^2$, and $K_{HP}=8$ (W/°C.cm$^2$). In the diagram, the solid line corresponds to t=0.03 cm, the dashed line to t=0.05 cm, and the alternate long and short dash line to t=0.07 cm.

As is clear from the diagram, $K_{CP}$ of 8 W/°C.cm$^2$ or greater is needed to obtain COP of 0.6 or greater. Even if $K_{CP}$ is increased to 20 W/°C.cm$^2$ or greater, no substantial extra advantage is available but such unduly large $K_{CP}$ leads to higher fabrication cost. Therefore $K_{CP}$ is in the range of 8-20 W/°C.cm$^2$, preferably in a range of 10-20 W/°C.cm$^2$.

Figure 34:
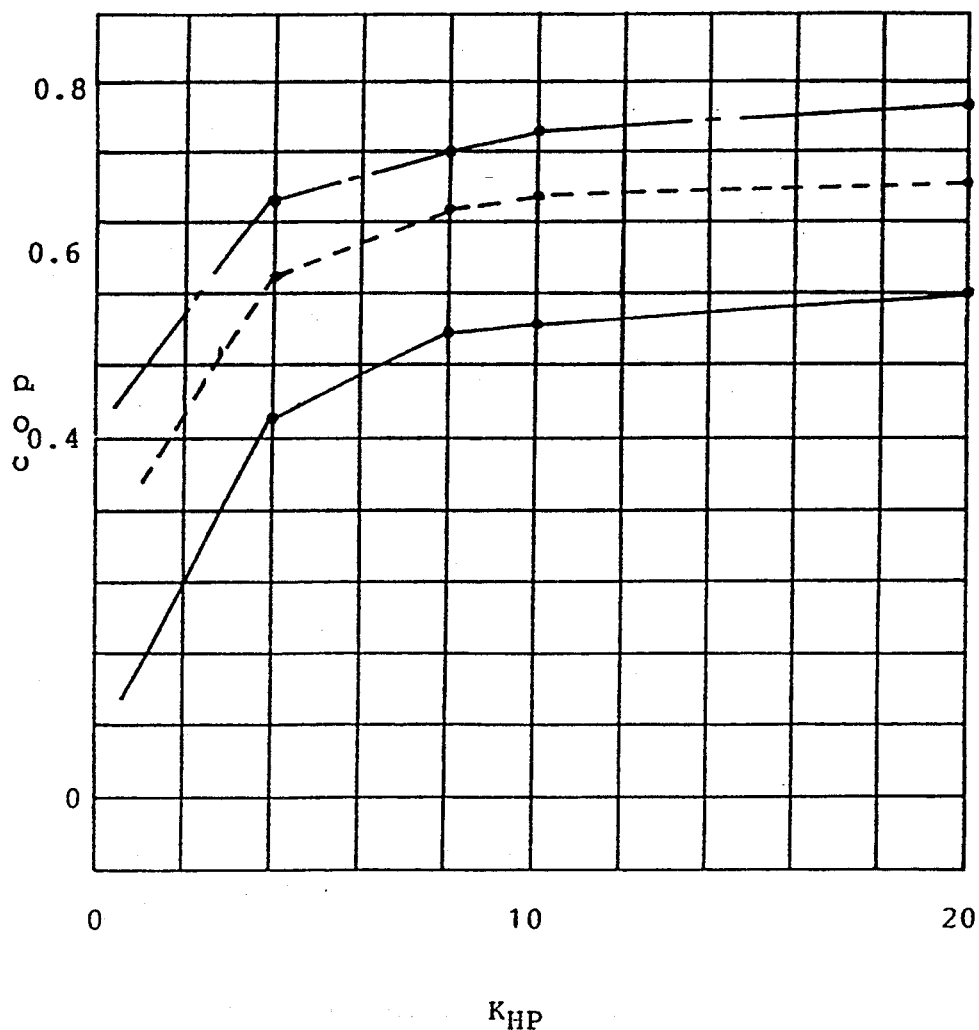
FIG. 34 is another characteristic diagram of $K_{HP}$ versus COP.
Figure 35:
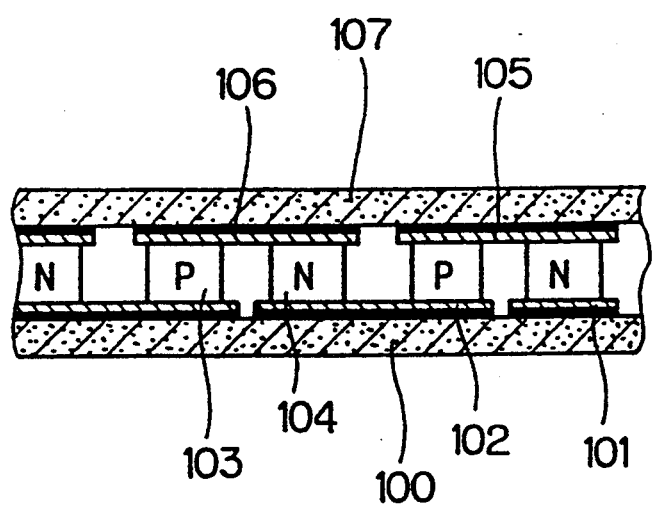
FIG. 35 is an enlarged fragmentary cross-sectional view of a conventional thermoelectric cooling device.
Figure 36:
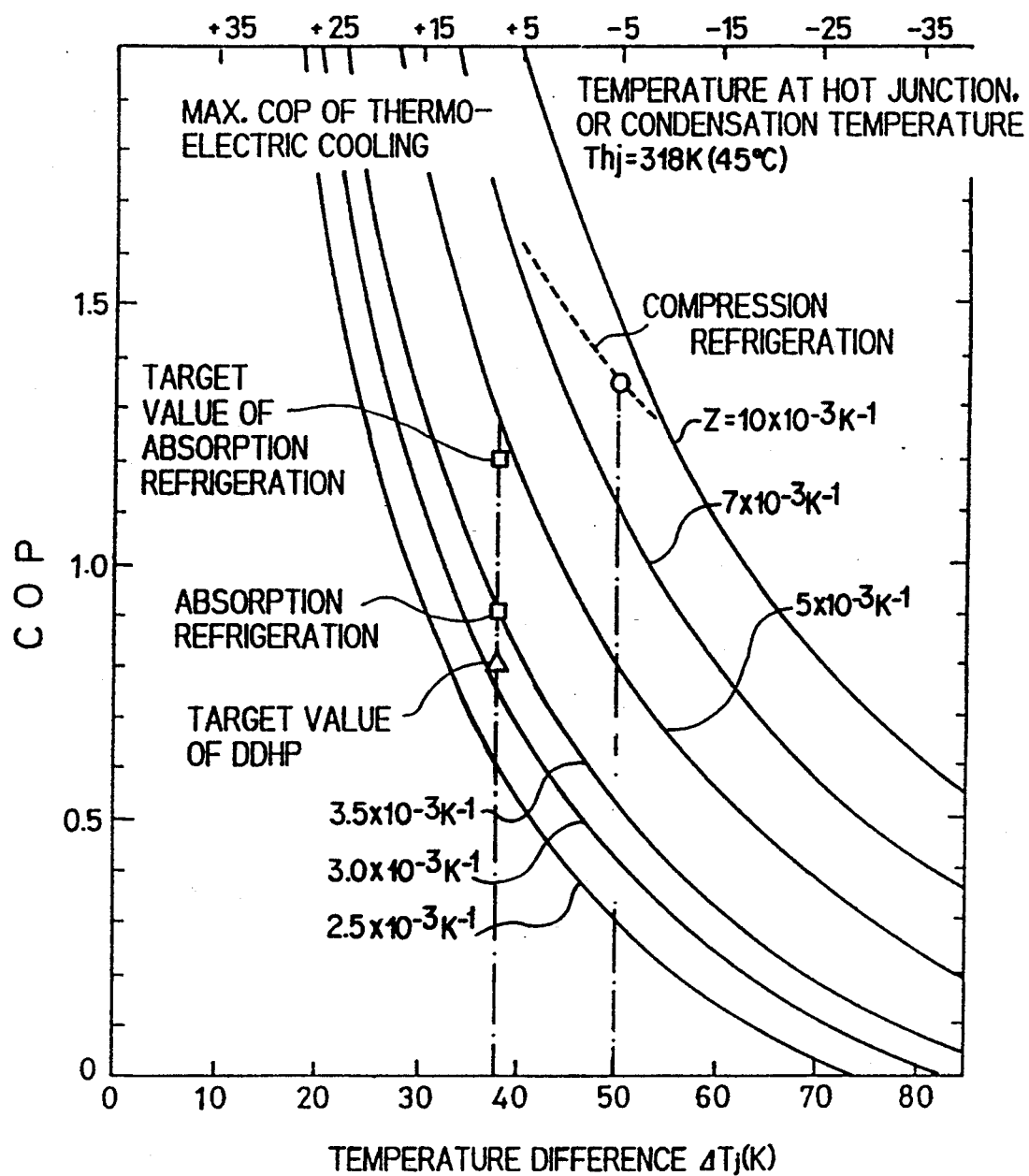
FIG. 36 is a characteristic diagram illustrating COPs of various cooling devices temperature as a function of the temperature difference.

FIG. 34 diagrammatically illustrates the relationship between $K_{HP}$ and COP when there were set $Z=3.0\times10^{-3}$ /K, $K_C=7$ (W/°C.cm$^2$), $K_H=7$ W/°C.cm$^2$, and $K_{CP}=8$ (W/°C.cm$^2$). In the diagram, the solid line corresponds to t=0.03 cm, the dashed line to t=0.05 cm, and the alternate long and short dash line to t=0.07 cm.

As is clearly envisaged from the diagram, $K_{HP}$ of 8 W/°C.cm$^2$ or greater is needed to obtain COP of 0.6 or greater. Even if $K_{HP}$ is increased to 20 W/°C.cm$^2$ or greater, no substantial extra advantage is available but such unduly large $K_{HP}$ leads to higher fabrication cost. Therefore $K_{HP}$ is in the range of 8-20 W/°C.cm$^2$, preferably in a range of 10-20 W/°C.cm$^2$.

Collectively considering FIG. 27 to FIG. 34, it is possible to divide the situation into two cases, one being the case where relatively thin semiconductor elements having a thickness t of 0.08 cm or greater are used (see FIGS. 27 to 30) and the other the case where extremely thin semiconductor elements having a thickness t smaller than 0.08 cm are used (see FIGS. 31 to 34).

Where semiconductor elements (t≧0.08 cm) are used, a thermoelectric cooling device whose COP is 0.6 or greater an be fabricated at low fabrication cost by controlling Z at $2.7\times10^{-3}$/K, $K_C$ and $K_H$ to the range of 3-10 W/°C.cm$^2$, and $K_{CP}$ and $K_{HP}$ to the range of 8-20 W/°C.cm$^2$.

Where semiconductor elements (t<0.08 cm) are used, on the other hand, a thermoelectric cooling device whose COP is 0.6 or greater an be fabricated at low fabrication cost by controlling Z at least 3.0 /K or above, $K_C$ and $K_H$ to the range of 7-10 W/°C.cm$^2$, and $K_{CP}$ and $K_{HP}$ to the range of 8-20 W/°C.cm$^2$. It has also been found through other experiments that, where such extremely thin semiconductor elements are used, Z smaller than 3.0 makes it difficult to achieve COP of 0.6 or greater in view of productivity and fabrication cost even if $K_C$, $K_H$, $K_{CP}$ and $K_{HP}$ are increased.

The present inventors have investigated in various ways with a view toward finding out a method for increasing the values of $K_{CP}$ and $K_{HP}$ to 8-20 W/°C.cm$^2$. As a result, it has been found that such high $K_{CP}$ and $K_{HP}$ values can be fully attained by, as will be described subsequently, using a high thermal-conductivity grease and thermally connecting each electrode with its corresponding outer heat conductor via a layer of the grease without using an insulating alumina substrate ($K_{CP}$, $K_{HP}$: about 3.3 W/°C.cm$^2$ at the ordinary thickness of 0.635 mm) unlike the conventional art.

The present inventors have also investigated in various ways with a view toward finding out a method for increasing the values of $K_C$ and $K_H$ to 3-10 W/°C.cm$^2$. As a result, it has also been found that such high $K_C$ and $K_H$ values can be fully achieved by forming the outer heat conductors with a high thermal-conductivity material such as copper or aluminum, causing forced convection of air by a fan with respect to fins having a sufficient heat transfer area and/or using a fan in combination with heat pipes having high heat transport efficiency.

Certain specific embodiments of the present invention will next be described with reference to the corresponding drawings.

The thermoelectric refrigerator making use of the thermoelectric cooling devices according to the first embodiment of the present invention will first be described with reference to FIG. 1 to FIG. 8.

Figure 1:
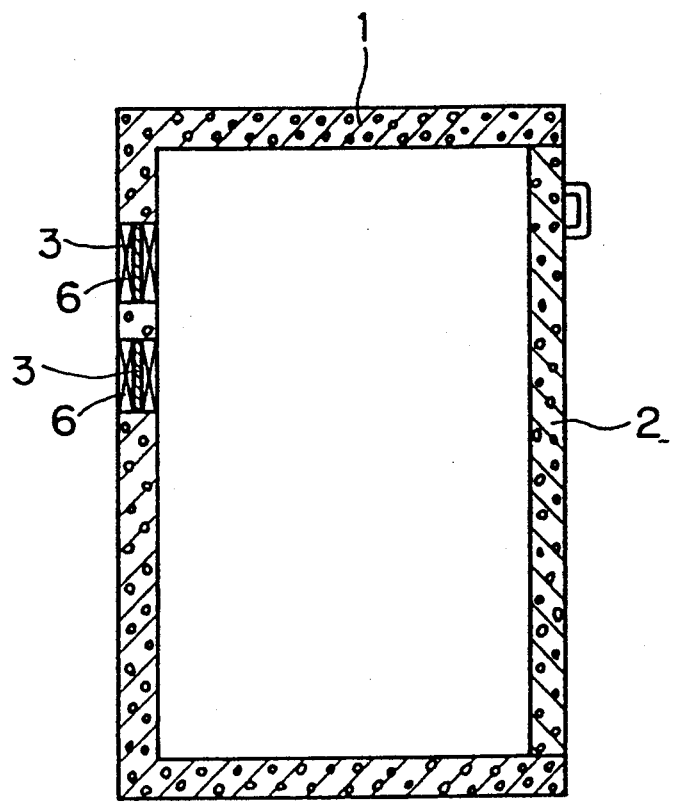
FIG. 1 is a simplified cross-sectional view of a thermoelectric refrigerator making use of thermoelectric cooling devices according to a first embodiment of the present invention.

As is depicted in FIG. 1, the thermoelectric refrigerator is equipped with a cabinet 1, which is made of a heat-insulating material such as foamed urethane resin, and a door 2 made of a similar heat-insulating material and openably arranged in a side wall of the cabinet 1. In a part of an upper rear wall of the cabinet 1, there are accommodated the thermoelectric cooling devices which pertain to the first embodiment of the present invention and are designated at numeral 3.

Figure 2:
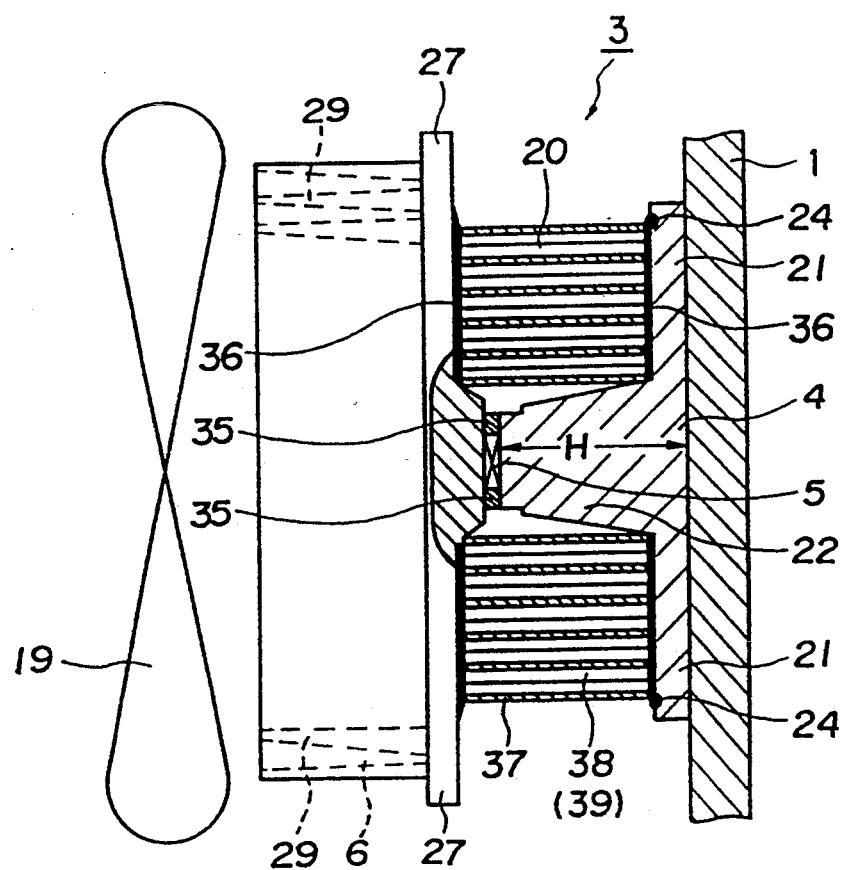
FIG. 2 is an enlarged fragmentary cross-sectional view of one of the thermoelectric cooling devices.

Each thermoelectric cooling device 3 is, as shown in FIG. 2, constructed primarily of a heat absorber 4, heatsinks 6, a series of thermoelectric cooling elements 5 interposed between the heat absorber 4 and the heatsinks 6, a support 20 and a fan 19.

The heat absorber 4 is made of aluminum and, to form a large area of contact with the side of the cabinet 1, is provided with flange portions 21 on opposite sides thereof. A trapezoidal portion 22 is centrally formed to permit mounting of the thermoelectric cooling element series 5 thereon. To minimize return of a stream of heat from the heatsinks 6 by convection and/or radiation, the heat absorber 4 has a predetermined height H so that a below-described flange portion 27 of the heatsinks 6 is located apart from the flange portions 21.

Figure 7:
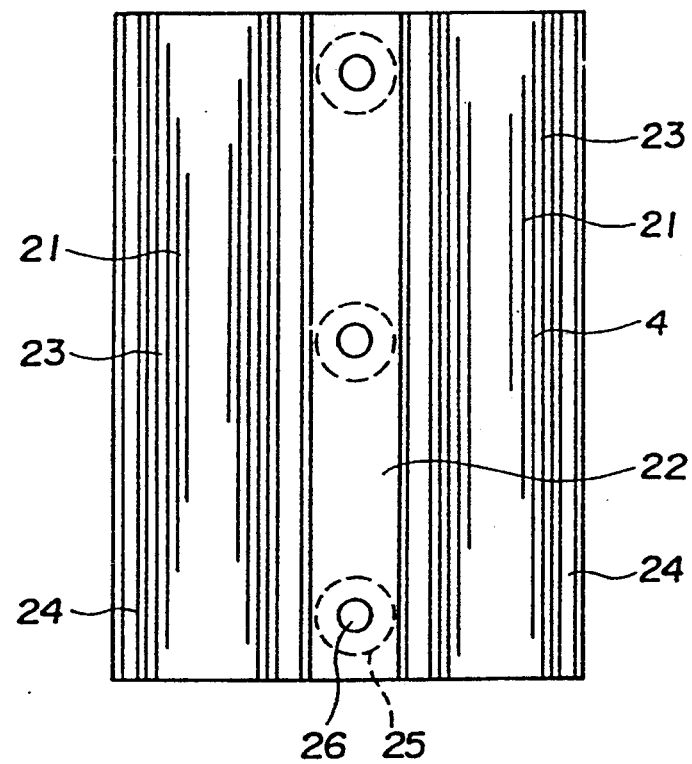
FIG. 7 is a plan view of a heat absorber used in the thermoelectric cooling device.
Figure 8:
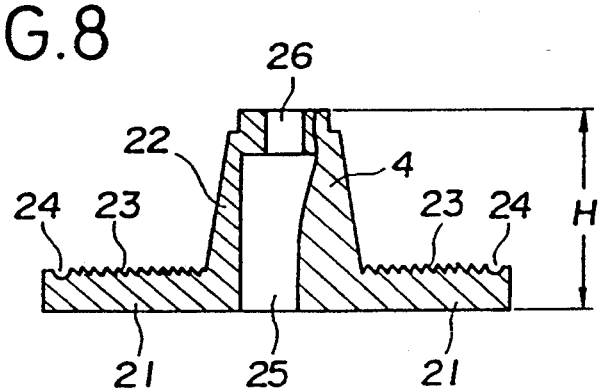
FIG. 8 is a cross-sectional view of the heat-absorber used in the thermoelectric cooling device.

As is illustrated in FIG. 7 and FIG. 8, one side of each flange portion 21, said one side being on a side opposite to that facing the interior of the refrigerator, defines a number of narrow grooves 23 of a V-shaped cross-section along the length of the flange portion 21 and adhesive-holding grooves 24 of a U-shaped cross-section outside the narrow grooves 23.

In the trapezoidal portion 22, three countersinks 25 and three element-mounting bores 26 are formed in pairs at predetermined intervals along the length of the trapezoidal portion 22.

As is shown in FIG. 2, flange portions 27 are also arranged on opposite sides of the heatsinks 6. Each flange portion 27 also defines a number of narrow grooves of a V-shaped cross-section as well as adhesive-holding grooves of a U-shaped cross-section (both not illustrated). Many blades 29 are disposed at right angles on one side of each flange portion 27, said one side being located on the side of the fan 19.

Figure 4A:
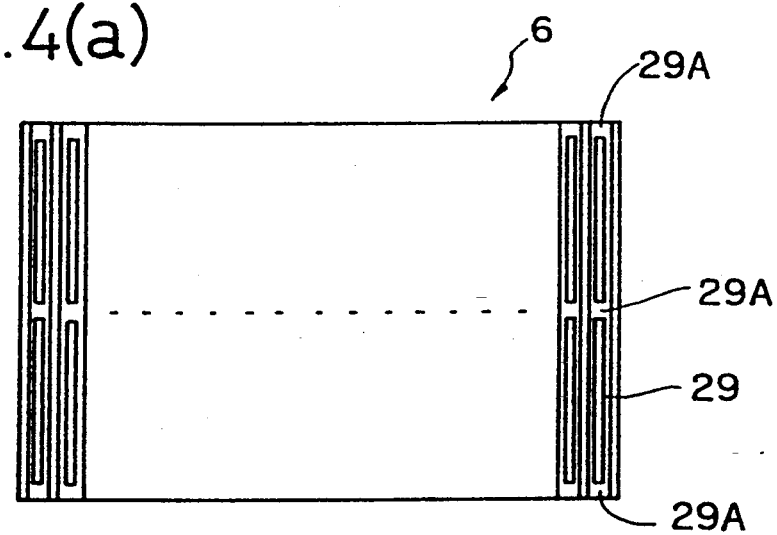
FIGS. 4(a) and 4(b) are schematic illustrations of heatsinks usable in the thermoelectric cooling device.
Figure 4B:
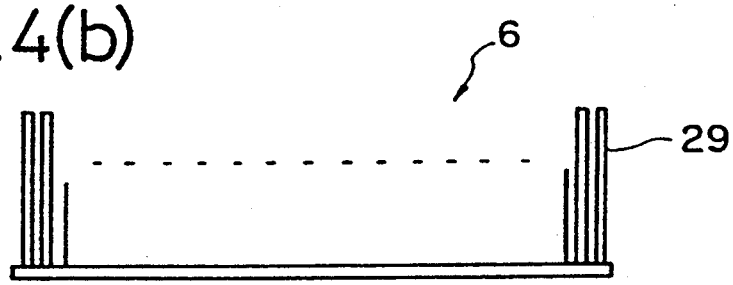

The blades 29 have been formed as shown in FIG. 4(b) by bending in a zig-zag pattern a metal sheet punched out in a prescribed shape. To ensure maintenance of a space between each blade and its adjacent blades, spacer portions 29A are integrally formed as illustrated in FIG. 4(a).

Figure 5:
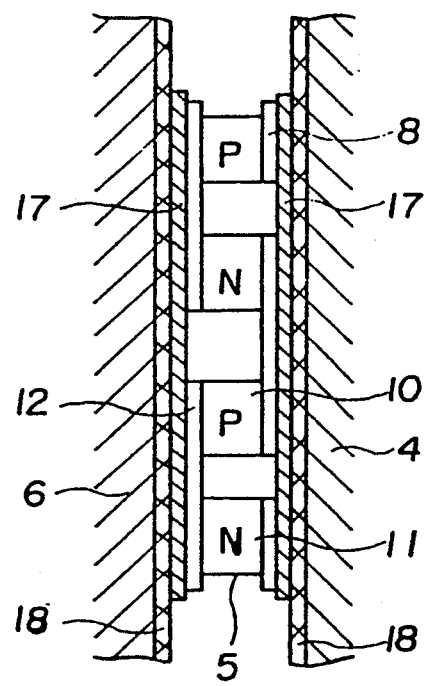
FIG. 5 is an enlarged cross-sectional view of a series of thermoelectric cooling elements used in the thermoelectric cooling device.
Figure 6:
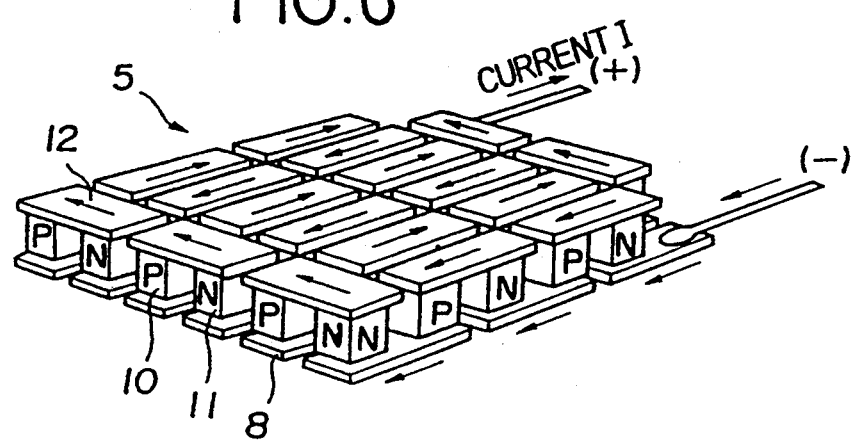
FIG. 6 is an enlarged perspective view of the thermoelectric cooling element series.

The thermoelectric cooling element series 5 is constructed, as depicted in FIG. 5 and FIG. 6, of heat-absorbing-side electrodes 8 arranged at predetermined intervals, p-type semiconductor layers 10 and n-type semiconductor layers 11 formed, for example, in the form of bulks or films (thick films or thin films) on the electrodes, and heat-dissipating-side electrodes 12 connecting the p-type semiconductor layers 10 and the n-type semiconductor layers 11 together. The numerous p-type semiconductor layers 10 and n-type semiconductor layers 11 are arranged in parallel and are electrically connected in series as depicted in FIG. 6.

As has been described above, insulating substrates such as those made of alumina ceramics are not used in the first embodiment, and the heat-absorbing-side electrodes 8 are exposed on one side and the heat-dissipating-side electrodes 12 on the other side.

High thermal-conductivity silicone grease layers 17,17 are formed between the individual thermoelectric cooling element series 5 and the heat absorber 4 and between the individual thermoelectric cooling element series 5 and the heatsinks 6, respectively, as shown in FIG. 5.

The silicone grease of the silicone grease layers 17 can suitably be a silicone grease formed of a base oil and not greater than 50 wt. % of a fine filler consisting of fine particles (average particle size: 10 μm or smaller) of an inorganic compound such as silica, alumina or zinc oxide or a metal such as silver, copper or aluminum. The thermal conductivity of each silicone grease layer 17 in which a filler is dispersed and contained at such a high content is as high as $6.0 \times 10^{-3}$ cal/cm·sec·°C. or more and, compared with $3 \times 10^{-4}$ cal/cm·sec·°C. of ordinary silicone grease, is higher by one figure or more. The silicone grease layers 17 retain good elasticity and stickiness over a wide temperature range of from $-55°$ C. to $200°$ C.

An extremely thin, electric insulating layer 18 made of alumite is formed on at least one side of each of the heat absorber 4 and heatsinks 6, said one side facing the thermoelectric cooling element series 5.

Figure 9:
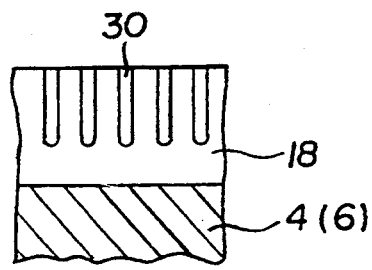
FIG. 9 is an enlarged cross-sectional view illustrating the state of an alumite surface.

Alumite is generally formed by anodization or the like. As is illustrated in FIG. 9, numerous pinholes 30 are formed extending from a surface of the electric insulating layer (alumite layer) toward the inside thereof. Although the insulating property of the electrical insulating layer 18 is not lowered to any substantial extent even after the pinholes 30 are formed in a large number, the existence of the pinholes 30 as are is practically equivalent to the formation of an air layer between the heat absorber 4 (or heat-dissipating fins 6) and the thermoelectric cooling element series 5, so that the thermal resistance becomes extremely high and the thermal conductivity is low.

To overcome this problem, a sealant 31 such as nickel acetate is caused to penetrate into the pinholes 30 in this embodiment so that the thermal conductivity is improved. Preferably, the pinholes 30 should entirely be filled up by the sealant 31. Penetration of the sealant 31 into the pinholes 30 even to a certain extent can substantially reduce the air layer so that improvements in thermal conductivity can be observed.

Figure 10:
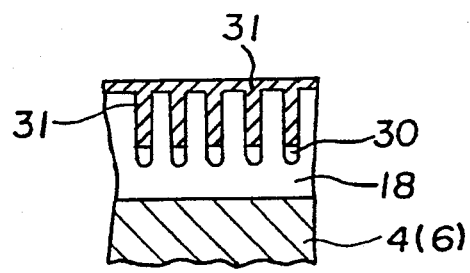
FIG. 10 is an enlarged cross-sectional view showing the state of the alumite surface after pinhole filling treatment.

Further, the formation of the film of the sealant 31 on the surface of the electric insulating layer 18 (alumite layer) as shown in FIG. 10 assures close contact with the silicone grease layer 17 so that the thermal conductivity is improved further.

As the thickness of the electrical insulating layer (alumite layer) 18, 3–20 μm or so are sufficient from the standpoint of electrical insulation.

When copper is used for the heat absorber 4 and heatsinks 6, it is only necessary to form, between each of the heat absorber 4 and the heatsinks 6, an electrical insulating layer 18 which contains fine particles of an inorganic compound such as silicon dioxide, alumina or chromium oxide and has a thickness as thin as 10–50 μm or so.

Figure 3:
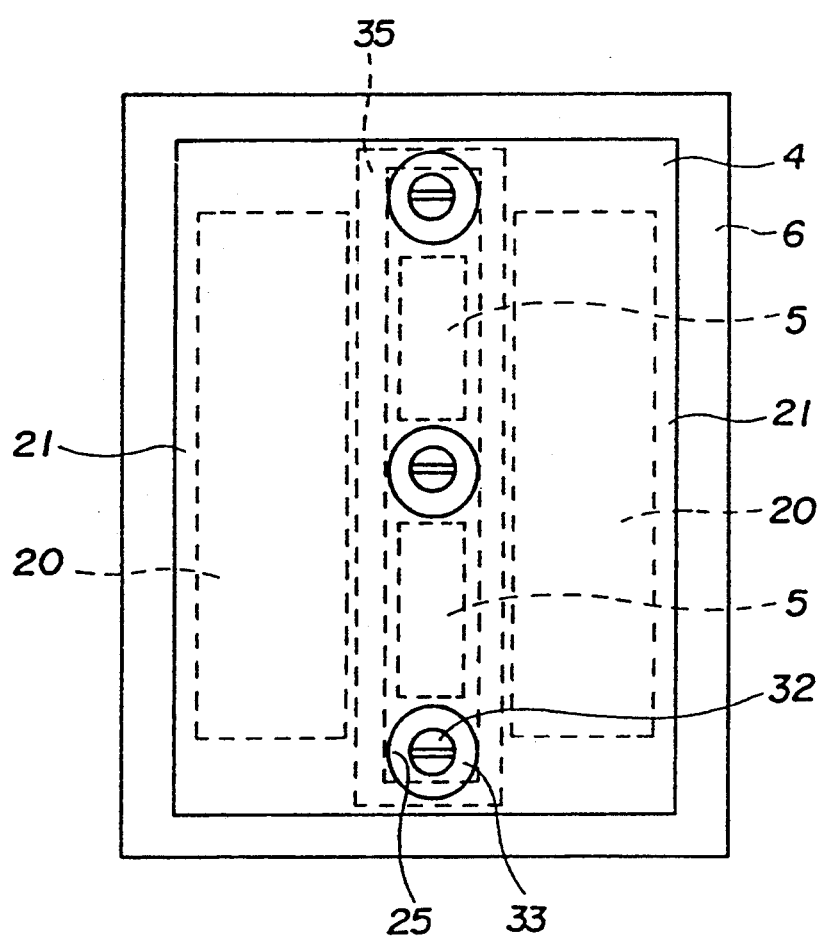
FIG. 3 is a right-hand side view of the thermoelectric cooling device.
Figure 11:
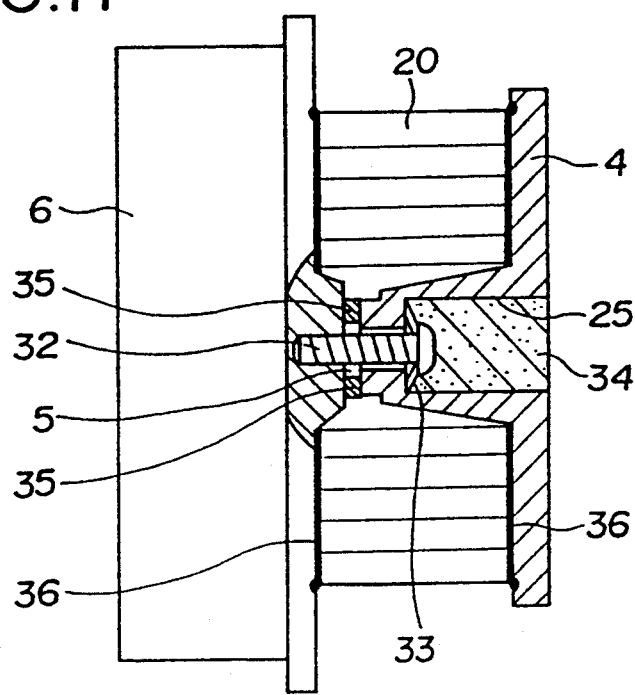
FIG. 11 is a fragmentary cross-sectional view illustrating a mounting structure for the thermoelectric cooling element series.
Figure 12:
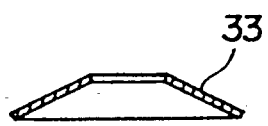
FIG. 12 is an enlarged cross-sectional view of a conical spring washer.

As is shown in FIG. 3, this embodiment includes two thermoelectric cooling element series 5 arranged at a predetermined interval along the length of the thermoelectric cooling device. Each thermoelectric cooling element series 5, as shown in FIG. 11, is interposed between the heat absorber 4 and the heatsinks 6 and is held by a fastening screw 32 and the conical spring washer 33, both inserted from the side of the countersink 25 of the heat absorber 4. In the first embodiment, a screw made of a polyamide containing glass fibers in a proportion of 50 wt. % is used as the fastening screw 32, while a stainless steel conical spring washer is employed as the conical spring washer 33. By this conical spring washer 33 and the silicone grease layers 17 interposed between the heat absorber 4 and the thermoelectric cooling element series 5 and between the heatsinks 6 and the thermoelectric cooling element series 5, respectively, the thermoelectric cooling element series 5 is resiliently held between the heat absorber 4 and the heatsinks 6.

In the first embodiment, after each fastening screw 32 is tightened, any hollow portion of the corresponding countersink is filled with a high thermal-conductivity silicone grease 34 of the same type as that employed for the silicone grease layers 17.

As is illustrate in FIG. 2, each thermoelectric element series 5 held between the heat absorber 4 and the heatsinks 6 is circumferentially sealed gas and liquid tight by a sealant layer 35. Usable examples of the sealant for the sealant layer 35 include epoxy resins, vinyl resins, amide resins, fluorocarbon resins, silicone resins and rubbers. Employed in the first embodiment is an epoxy resin containing 20–65 wt. % (preferably 30–60 wt. %) of fine hollow glass beads dispersed uniformly therein. These fine hollow glass beads have a diameter of 20–130 μm, a wall thickness of 0.5–2 μm and an average specific gravity of 0.1–0.4. The epoxy resin containing the fine hollow glass beads has a very low thermal conductivity of $1 \times 10^{-4}$ cal/cm·sec·°C.

Figure 13:
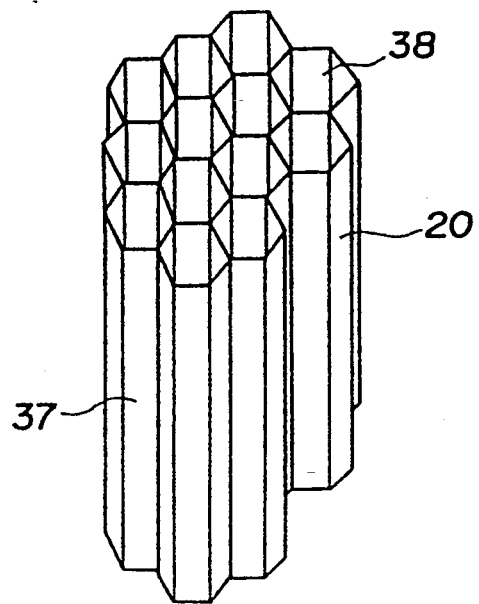
FIG. 13 is a fragmentary perspective view of a support.

Between the flange portions 21 of the heat absorber 4 and the flange portions 27 of the heatsinks 6, the support 20 is interposed with the length of its peripheral wall 37 extending between the flange portions 21 and the flange portions 27 as shown in FIG. 2. The support 20 has a honeycomb structure as depicted in FIG. 13 and is made of a material having practically no elasticity, in other words, high stiffness and low thermal conductivity, for example, a water-repellant-treated paper, a synthetic resin, a ceramic, a metal designed to have low thermal conductivity, a hard rubber such as high-strength urethane, or wood. In particular, a paper-made support treated with a water repellant such as paraffin, wax or fluorocarbon oil can be recommended because it is non-elastic, has sufficient stiffness and light weight and can be produced at low cost.

The flange portions 21 and the support 20 are integrally bonded by an adhesive layer 36, and the flange portions 27 and the support 20 are also integrally bonded with another adhesive layer 36. Usable illustrative adhesives for the adhesive layers 36 include epoxy resins, vinyl resins, amide resins, polyester resins, and rubbers. In this embodiment, an epoxy resin is used.

Formation of many narrow grooves in the flange portions 21,27 as described above facilitates spreading of the adhesive so that the adhesive can be retained in a sufficient amount at the adhered portions. The fixed securement between the support 20 and the flange portions 21,27 is therefore ensured.

Because of the honeycomb structure, the support 20 internally defines many independent hollow compartments. As the support 20 is interposed between the flange portions 21 and the flange portions 27 as described above, a number of independent air layers 39 are formed by the hollow compartments 38 as illustrated in FIG. 2.

Incidentally, it is to be noted that the term "honeycomb structure" as used herein means, besides structures having the hexagonal hollow compartments 38 as viewed in plan as depicted in FIG. 13, those defining many hollow compartments having, for example, a polygonal shape such as a triangular, rectangular or pentagonal shape or a desired shape such as a circular or oval shape as viewed in plan, said hollow compartments being independent by peripheral walls which are integrally connected together. This honeycomb structure can be recommended in particular, since it can simultaneously provide high stiffness and the many independent hollow compartments 38 (air layers 39).

This support 20 is, as shown in FIG. 3, fixed on an outer surface of the sealant layer 35 on the opposite sides of the thermoelectric cooling element series 5 so that the thermoelectric cooling element series 5 can be mechanically protected.

A description will next be made of a process for the fabrication of a semiconductor useful in the practice of the present invention. As one example of the process, there is plasma-activated sintering. According to this process, a voltage is directly applied across a granulated ceramic mix to be formed. A plasma discharge is thus produced between particles of the granulated ceramic mix so that surfaces of the particles are activated. As a result, deposited oxides and adsorbed gas are eliminated from the surfaces of the particles. Sintering can therefore be effected in a short time under low pressure.

Figure 14:
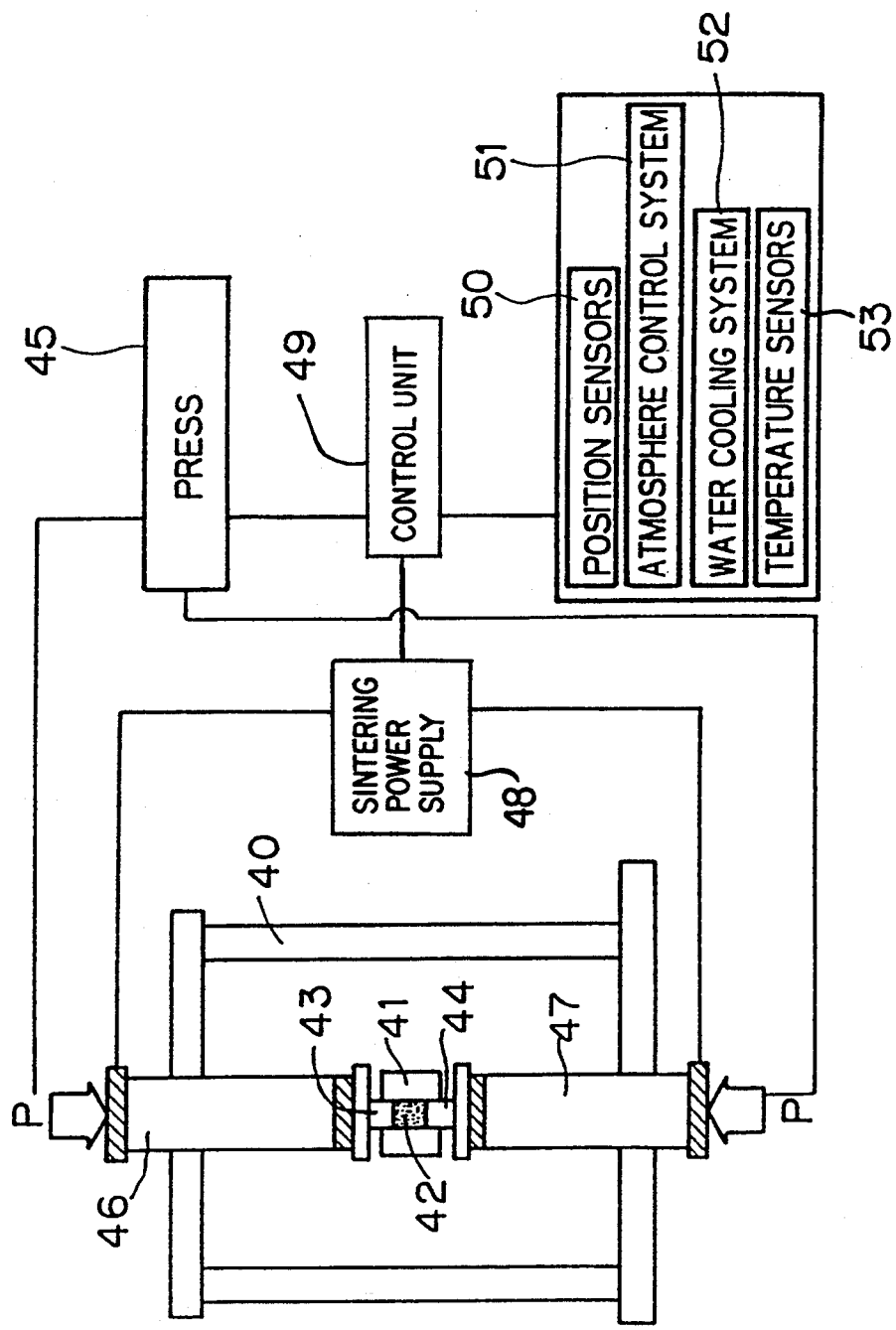
FIG. 14 is a simplified block diagram of a plasma sintering apparatus.

Referring next to FIG. 14, the plasma sintering apparatus will be described. Inside a chamber 40, a granulated ceramic mix 42 to be sintered is placed within a sintering die 41. The granulated ceramic mix 42 is held between an upper punch 43 and a lower punch 44, followed by the vertical application of a predetermined pressure by a press 45.

A pulsated current is fed from a sintering power supply 48 across an upper punch electrode 46 connected to the upper punch 43 and a lower punch electrode 47 connected to the lower punch 44. Sintering is conducted while producing a plasma discharge between particles of the granulated ceramic mix 42.

Incidentally, the sintering powder mix 42 which has been subjected to provisional pressing can be placed within the sintering die together with metal electrodes, for example, thin metal sheets or powdered metal layers superposed thereon. This makes it possible to integrally form metal electrodes concurrently with the sintering of a semiconductor.

The press 45 and the sintering power supply 48 are connected to a control unit 49 which governs the pressure and pulsated current to be applied to the sintering powder mix 42. This control unit 49 is in turn connected to position sensors 50, an atmosphere control system 51, a water-cooling system 52, temperature sensors 53, etc.

As sintering conditions when $(Bi.Sb)_2(Te.Se)_3$ is used by way of example as the sintering powder mix 42, it is appropriate to choose an argon atmosphere of reduced pressure, a sintering pressure of 250 kg/cm² and a sintering temperature of 250°–400° C.

Figure 15:
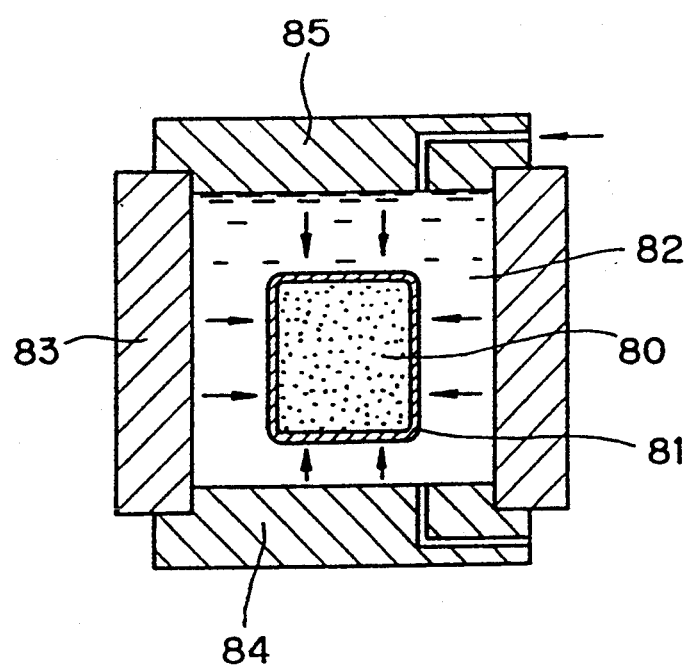
FIG. 15 is a simplified block diagram of an isostatic sintering apparatus.

Isotactic pressing can also be mentioned as another fabrication process for the fabrication of a semiconductor usable in the present invention. As is illustrated in FIG. 15, a granulated ceramic mix 80 for the semiconductor is filled in a pliable mold 81 made of rubber or the like. The mold 81 with the granulated ceramic mix 80 filled therein is immersed in a pressing medium 82 of a pressure vessel. The pressure vessel is constructed of a cylinder 83, a lower lid 84 and an upper lid 85. The pressure vessel is filled with the pressing medium 82 which, for example, consists of a mixture of polypropylene glycol and water. By the pressing medium 82, the granulated ceramic mix 80 is compression formed isotropically and isostatically. The process making use of the pressing medium 82 is a wet process. A dry process can also be applied, in which a granulated ceramic mix is filled in a pliable mold and the mold with the granulated ceramic mix filled therein is directly placed in a pressure vessel for isotropic and isostatic compression.

The thermoelectric cooling device according to the second embodiment of the present invention will next be described with reference to FIGS. 16 and 17.

Figure 16:
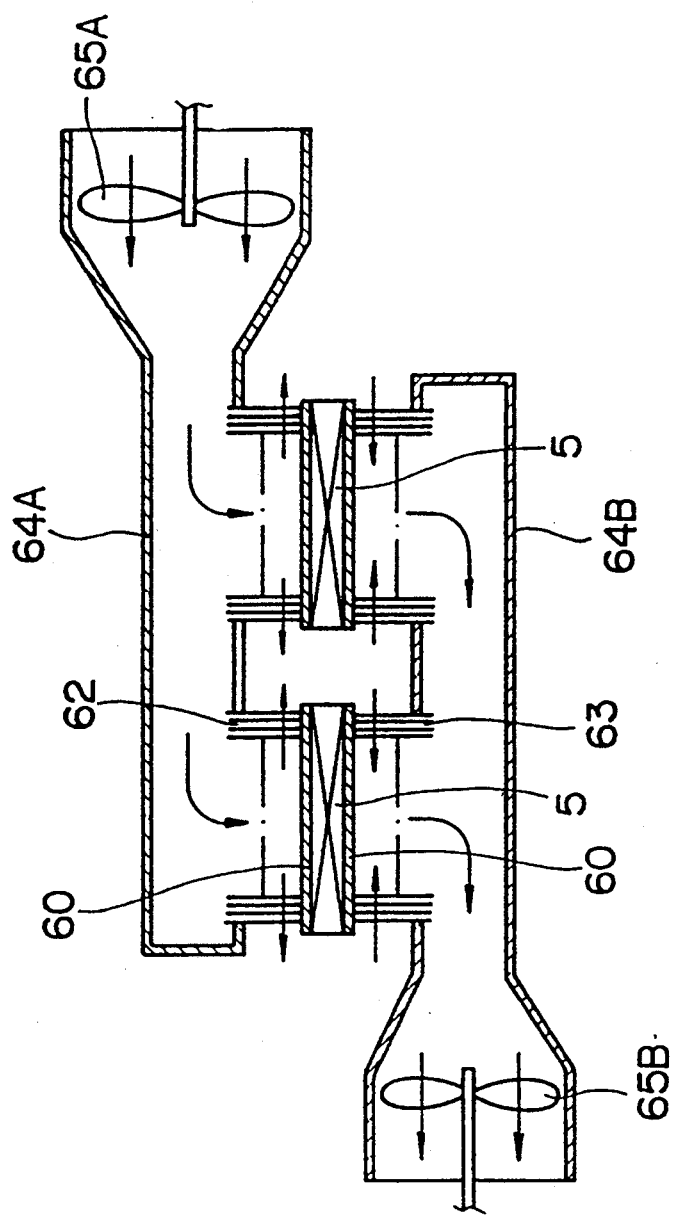
FIG. 16 is a simplified cross-sectional view of a thermoelectric cooling device according to a second embodiment of the present invention.
Figure 17:
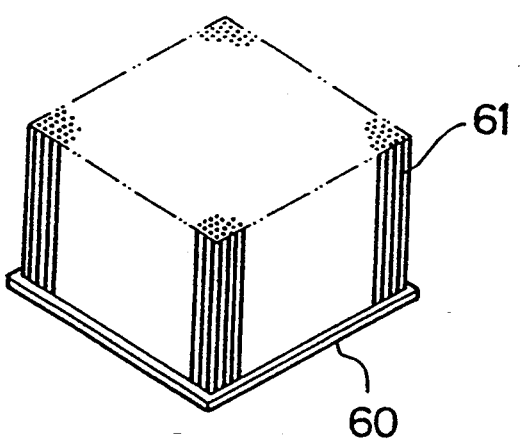
FIG. 17 is a perspective view of a pin-shaped fins used in the thermoelectric cooling device of the second embodiment.

As is shown in FIG. 16, heat-absorbing-side fins 62 formed of numerous pin-shaped fins 61 arranged on a base board 60 are bonded on one side (upper side) of each thermoelectric cooling element series 5. On the other side (lower side) of the thermoelectric cooling element series 5, heat-dissipating-side fins 63 formed of numerous pin-shaped fins 61 disposed on a base board 60 are bonded. Each thermoelectric cooling device series 5 is of the same construction as those employed in the first embodiment. Silicone grease (not shown) similar to that mentioned above is interposed between each thermoelectric cooling element series 5 and its associated base boards 60.

The heat-absorbing-side fins 62 are enclosed within a heat-absorbing-side duct 64A so that air can be forcedly fed axially of the heat-absorbing-side fins 62. On the other hand, the heat-dissipating-side fins 63 are enclosed within a heat-dissipating-side duct 64B so that air present around the heat-dissipating-side fins 62 can be forcedly drawn by a heat-dissipating-side fan 65B.

Usable examples of the pin-shaped fins 61 include those having a pin diameter of 0.3-0.5 mm, a pin pitch of 0.9-2.5 mm and a pin height of 5-20 mm. A desired heat transfer area can be obtained by choosing and combining these parameters.

Figure 18:
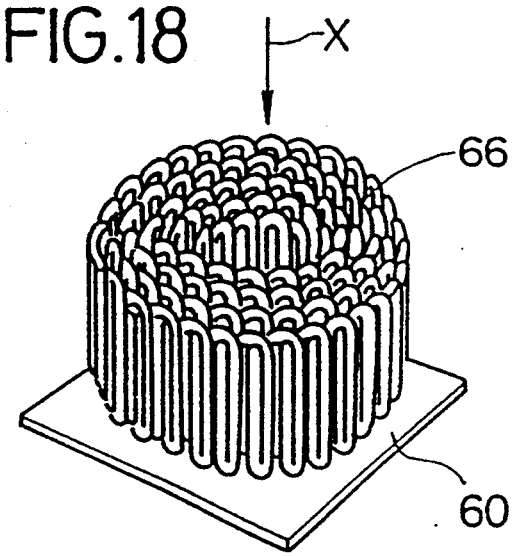
FIG. 18 is a perspective view of heat-pipe fins used in a thermoelectric cooling device according to a third embodiment of the present invention.

FIG. 18 illustrates the fins used in the thermoelectric cooling device according to the third embodiment of the present invention. In this embodiment, small-diameter heat pipes 66 in the form of loops are arranged on a base board 60. Heat is promptly transferred through evaporation and condensation of a working medium (for example, a volatile liquid such as an alcohol) filled in the heat pipes 66. The thermal resistance when these heat pipes 66 are used is 0.8° C./W or lower when the cooling wind velocity and the input power are 2 m/s and 50 W, respectively.

Figure 19:
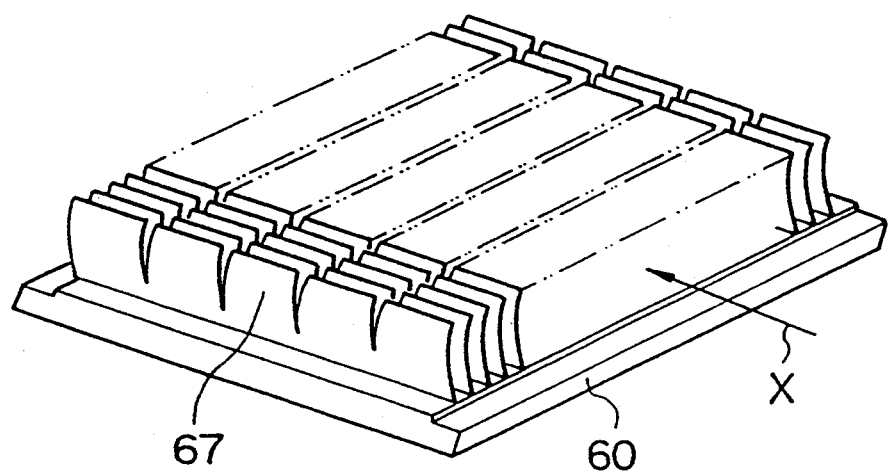
FIG. 19 is a perspective view of fins used in a thermoelectric cooling device according to a fourth embodiment of the present invention.

FIG. 19 shows the fins employed in the thermoelectric cooling device according to the fourth embodiment of the present invention. In this embodiment, arcuate tab-shaped fins 67 are arranged at predetermined pitches in several rows on a base board 60.

In FIG. 18 and FIG. 19, arrow X indicates the air-feeding direction. In the embodiment of FIG. 19, the individual tab-shaped fins 67 are arranged in row in the air-feeding direction X. However the individual tab-shaped fins 67 can also be arranged in a zig-zag pattern in the air-feeding direction X.

Figure 20:
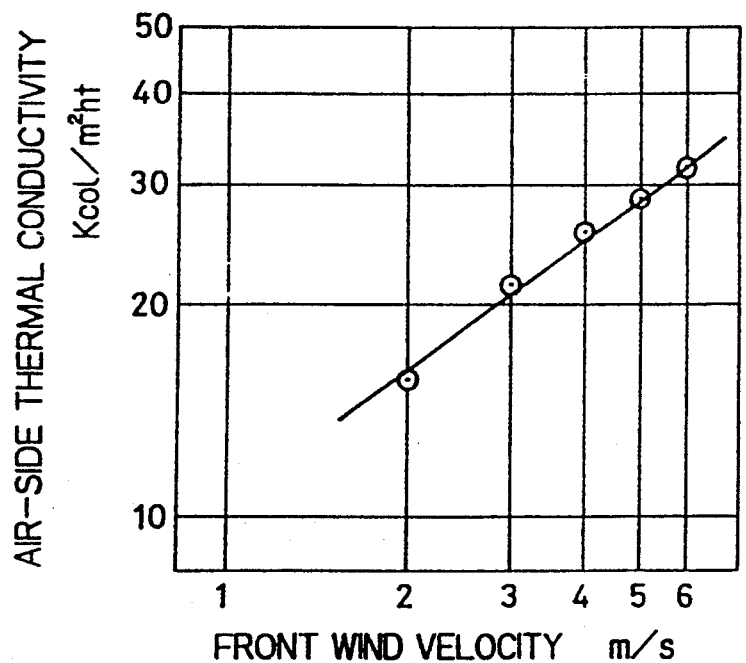
FIG. 20 is a characteristic diagram depicting heat transfer coefficients (air-side thermal conductivities) as a function of the face (front wind) velocity of the fins shown in FIG. 19.
Figure 21:
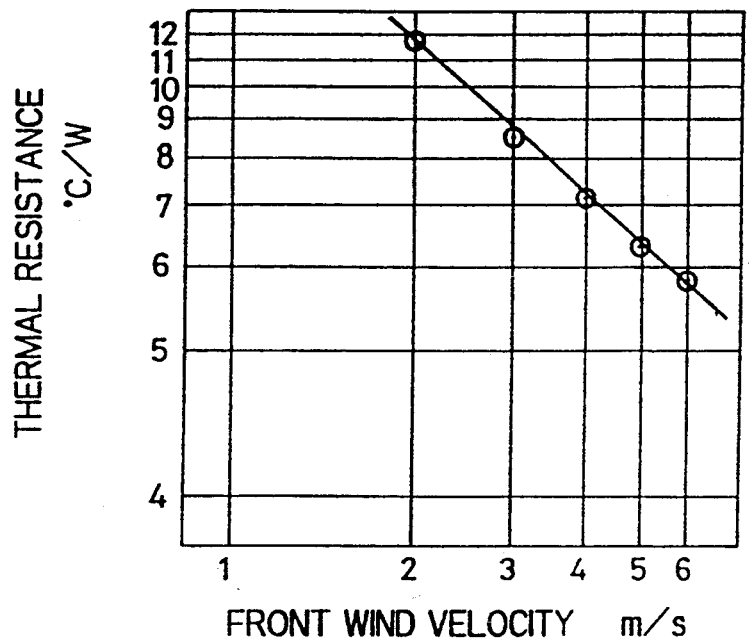
FIG. 21 is a characteristic diagram illustrating thermal resistances as a function of the face (front wind) velocity of the fins shown in FIG. 19.

FIG. 20 is the characteristic diagram depicting air-side thermal conductivities as a function of the face (front wind) velocity of the fins shown in FIG. 19, whereas FIG. 21 is the characteristic diagram illustrating thermal resistances as a function of the face (front wind) velocity of the same fins. It is understood that the fins have an excellent heat transfer characteristic.

Figure 22:
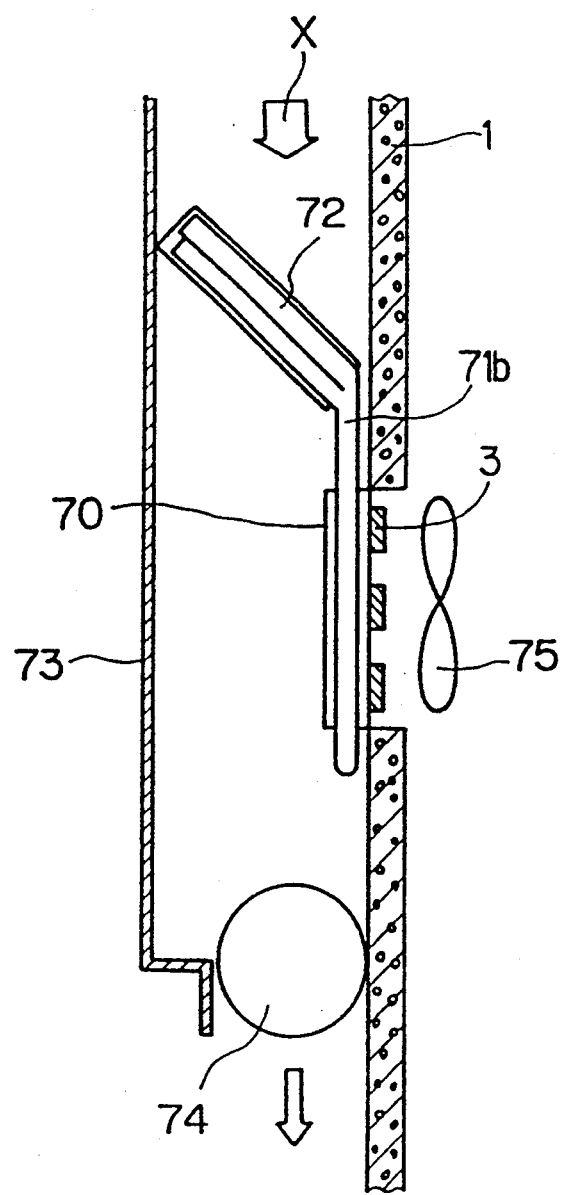
FIG. 22 is a cross-sectional view of a thermoelectric cooling device according to a fifth embodiment of the present invention.

The thermoelectric cooling device according to the fifth embodiment of the present invention will now be described with reference to FIG. 22 and FIG. 23. As is illustrated in FIG. 22, a thermoelectric cooling device 3 is mounted on a planar heat-receiving portion 70 of heat pipes via a silicone grease (not shown). Evaporator-side tubing 71a and condenser-side tubing 71b of the heat pipes are connected to the heat-receiving portion 70. Opposite ends of the tubings 71a,71b are connected to a fanned, heat-dissipating portion 72 of the heat pipes, which heat-dissipating portion 72 is disposed in an inclined position. The heat pipes include wicks internally formed therein and are filled, for example, with a volatile working medium such as an alcohol. Through repeated evaporation and condensation of the working medium, the heat pipes can absorb heat from the thermoelectric cooling device 3 and can dissipate it.

The heat-receiving portion 70, the heat-dissipating portion 72, and the like are enclosed within a duct 73. A cooling blower 74 is disposed in a 10 lower part of the duct 73 so that air is fed in the direction indicated by arrow X. Incidentally, numeral 75 indicates an interior fan which blows air toward the heat-absorbing side of the thermoelectric cooling device 3.

Use of flexible ones as the heat pipes makes it possible to reduce impact and vibrations which are applied to the thermoelectric cooling device.

We claim:

1. A thermoelectric cooling device for a thermoelectric refrigerator, said device being composed of:
   a number of p-type semiconductor layers and n-type semiconductor layers arranged side by side,
   a first inner heat conductor having heat-absorbing-side electrodes disposed outside heat-absorbing-side ends of the p-type and n-type semiconductor layers,
   a first outer heat conductor disposed outside the first inner heat conductor,
   a second inner heat conductor having heat-dissipating-side electrodes disposed outside heat-dissipating-side ends of the p-type and n-type semiconductor layers, and
   a second outer heat conductor disposed outside the second inner heat conductor,
   said p-type semiconductor layers and said n-type semiconductor layers being electrically connected in alternating series via said heat-absorbing-side electrodes and said heat-dissipating-side electrodes,
   wherein said p-type semiconductor layers and n-type semiconductor layers have an average thickness of at least 0.08 but greater than 0 cm, and the average figures of merit of said p-type semiconductor layers and n-type semiconductor layers are controlled at $2.7 \times 10^{-3}$ /k or above, the thermal conductance of said first inner heat conductor within a range of 8-20 w/°C.cm$^2$ of the cross-sectional area of both the p-type and n-type semiconductor layers, the thermal conductance of said first outer heat conductor within a range of 3-10 w/°C.cm$^2$ of the cross-sectional area of both the p-type and n-type semiconductor layers, the thermal conductance of said second inner heat conductor within a range of 8-20 w/°C.cm$^2$ of the cross-sectional area of both the p-type and n-type semiconductor layers, and the thermal conductance (of said second outer heat conductor within a range of 3-10 w/°C.cm$^2$ of the cross-sectional area of both the p-type and n-type semiconductor layers, whereby the coefficient of performance defined in terms of the ratio of the quantity of absorbed heat to inputted power is at least 0.6.

2. A device of claim 1, wherein said p-type semiconductor layers and n-type semiconductor layers have an average thickness of from 0.08 to 0.15 cm and the average figures of merit of said p-type semiconductors and n-type semiconductors are controlled within a range of from $2.7 \times 10^{-3}$ to $3.5 \times 10^{-3}$ /K.

3. A thermoelectric cooling device for a thermoelectric refrigerator, said device being composed of:
   a number of p-type semiconductor layers and n-type semiconductor layers arranged side by side,
   a first inner heat conductor having heat-absorbing-side electrodes disposed outside heat-absorbing-side ends of the p-type and n-type semiconductor layers,
   a first outer heat conductor disposed outside the first inner heat conductor,
   a second inner heat conductor having heat-dissipating-side electrodes disposed outside heat-dissipating-side ends of the p-type and n-type semiconductor layers, and
   a second outer heat conductor disposed outside the second inner heat conductor,
   said p-type semiconductor layers and said n-type semiconductor layers being electrically connected in alternating series via said heat-absorbing-side electrodes and said heat-dissipating-side electrodes, wherein said p-type semiconductor layers and n-type semiconductor layers have an average thickness smaller than 0.08 cm but greater than 0 cm, and the average figures of merit of said p-type semiconductor layers and n-type semiconductor layers are controlled at $3.0 \times 10^{-3}$ /K or above, the thermal conductance of said first inner heat conductor within a range of 8–20 w/°C.cm² of the cross-sectional area of both the p-type and n-type semiconductor layers, the thermal conductance of said first outer heat conductor within a range of 7–10 w/°C.cm² of the cross-sectional area of both the p-type and n-type semiconductor layers, the thermal conductance of said second inner heat conductor within a range of 8–20 w/°C.cm² of the cross-sectional area of both the p-type and n-type semiconductor layers, and the thermal conductance of said second outer heat conductor within a range of 7–10 w/°C.cm² of the cross-sectional area of both the p-type and n-type semiconductor layers, whereby the coefficient of performance defined in terms of the ratio of the quantity $J_Q$ of absorbed heat to inputted power is at least 0.6.

4. A device of claim 3, wherein said p-type semiconductor layers and n-type semiconductor layers have an average thickness t of at least 0.03 but smaller than 0.08 cm and the average figures of merit of said p-type semiconductors and n-type semiconductors is controlled within a range of from $3.0 \times 10^{-3}$ to $3.5 \times 10^{-3}$ /K.

5. A device of any one of claims 1–4, wherein said first and second inner heat conductors are formed primarily of filler-containing silicone grease layers interposed between said heat-absorbing-side and heat-dissipating-side electrodes and said first and second outer heat conductors, respectively.

6. A device of any one of claims 1–4, wherein said first and second inner heat conductors are formed primarily of filler-containing silicone grease layers interposed between said heat-absorbing-side and heat-dissipating-side electrodes, and said first and second outer heat conductors, respectively; and said first and second outer heat conductors are each provided with a thin electrical insulating layer formed on a surface thereof facing the associated silicone grease layer.

7. A device of claim 1, wherein said first and second outer heat conductors are provided with fins and fans for effecting forced air cooling against the fins.

8. A device of claim 7, wherein said fins are heat pipe fins.

9. A device of claim 1, wherein said second outer heat conductor is formed of heat pipes and a fan is arranged to effect forced air cooling against heat-dissipating portions of said heat pipes.

10. A process for the fabrication of a semiconductor suitable for use in a thermoelectric cooling device of claim 1 or 3 for a thermoelectric refrigerator, which comprises:

sintering a granulated ceramic mix for the semiconductor while applying a predetermined voltage across the granulated ceramic mix to produce a plasma discharge between particles of the granulated ceramic mix and hence activating surfaces of the particles and eliminating deposited oxides and adsorbed gas from the surfaces of the particles.

11. A thermoelectric refrigerator comprising a thermoelectric cooling device of claim 1 or 3, wherein said first inner heat conductor and said first outer heat conductor are arranged inside a cabinet of the refrigerator, said second inner heat conductor and said second outer heat conductor are arranged outside the cabinet of the refrigerator, and at least said second outer heat conductor is provided with a fan for effecting forced air cooling against said second outer heat conductor.

* * * * *